(12) United States Patent
Chibvongodze et al.

(10) Patent No.: US 11,335,671 B2
(45) Date of Patent: May 17, 2022

(54) STACKED DIE ASSEMBLY INCLUDING DOUBLE-SIDED INTER-DIE BONDING CONNECTIONS AND METHODS OF FORMING THE SAME

(71) Applicant: SANDISK TECHNOLOGIES LLC, Addison, TX (US)

(72) Inventors: Hardwell Chibvongodze, Hiratsuka (JP); Zhixin Cui, Yokohama (JP); Rajdeep Gautam, Nagoya (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 72 days.

(21) Appl. No.: 16/886,164

(22) Filed: May 28, 2020

(65) Prior Publication Data
US 2021/0375847 A1 Dec. 2, 2021

(51) Int. Cl.
*H01L 25/18* (2006.01)
*H01L 23/00* (2006.01)
(Continued)

(52) U.S. Cl.
CPC .............. *H01L 25/18* (2013.01); *G11C 7/06* (2013.01); *G11C 7/12* (2013.01); *H01L 24/06* (2013.01);
(Continued)

(58) Field of Classification Search
CPC ......... H01L 25/18; H01L 24/46; H01L 24/06; H01L 24/29; H01L 25/50; H01L 24/43; H01L 24/83; H01L 2924/14511; H01L 2224/96181; H01L 23/00; H01L 25/00; G11C 7/12; G11C 7/06
(Continued)

(56) References Cited

U.S. PATENT DOCUMENTS 6,351,028 B1 * 2/2002 Akram ................ H01L 23/3185
257/686
8,456,856 B2 * 6/2013 Lin ..................... H01L 23/3171
361/783

(Continued)

OTHER PUBLICATIONS

Notification of Transmittal of the International Search Report and the Written Opinion of the International Searching Authority for International Patent Application No. PCTUS2020/067424, dated May 6, 2021, 12 pages.
(Continued)

*Primary Examiner* — Alexander O Williams
(74) *Attorney, Agent, or Firm* — The Marbury Law Group PLLC

(57) ABSTRACT

Multiple bonded units are provided, each of which includes a respective front-side die and a backside die. The two dies in each bonded unit may be a memory die and a logic die configured to control operation of memory elements in the memory die. Alternatively, the two dies may be memory dies. The multiple bonded units can be attached such that front-side external bonding pads have physically exposed surfaces that face upward and backside external bonding pads of each bonded unit have physically exposed surfaces that face downward. A first set of bonding wires can connect a respective pair of front-side external bonding pads, and a second set of bonding wires can connect a respective pair of backside external bonding pads.

20 Claims, 16 Drawing Sheets

(51) Int. Cl.
*G11C 7/12* (2006.01)
*H01L 25/00* (2006.01)
*G11C 7/06* (2006.01)

(52) U.S. Cl.
CPC .............. *H01L 24/29* (2013.01); *H01L 24/43* (2013.01); *H01L 24/46* (2013.01); *H01L 24/83* (2013.01); *H01L 25/50* (2013.01); *H01L 2224/06181* (2013.01); *H01L 2924/14511* (2013.01)

(58) Field of Classification Search
USPC ........................................................ 257/686
See application file for complete search history.

(56) References Cited

U.S. PATENT DOCUMENTS

| | | | |
|---|---|---|---|
| 9,391,048 B2* | 7/2016 | Lee | H01L 25/0657 |
| 10,283,493 B1* | 5/2019 | Nishida | H01L 25/18 |
| 10,354,987 B1* | 7/2019 | Mushiga | H01L 21/76898 |
| 10,381,362 B1* | 8/2019 | Cui | H01L 27/11573 |
| 10,510,738 B2 | 12/2019 | Kim et al. | |
| 10,665,581 B1 | 5/2020 | Zhou et al. | |
| 2001/0046167 A1 | 11/2001 | Ayukawa et al. | |
| 2001/0048616 A1 | 12/2001 | Ayukawa et al. | |
| 2002/0131318 A1 | 9/2002 | Ayukawa et al. | |
| 2003/0206478 A1 | 11/2003 | Ayukawa et al. | |
| 2005/0128853 A1 | 6/2005 | Ayukawa et al. | |
| 2007/0069374 A1 | 3/2007 | Chen et al. | |
| 2007/0069390 A1 | 3/2007 | Chen et al. | |
| 2007/0278657 A1 | 12/2007 | Lee | |
| 2008/0237848 A1 | 10/2008 | Yoshikawa et al. | |
| 2008/0277782 A1 | 11/2008 | Chen et al. | |
| 2009/0245004 A1 | 10/2009 | Ayukawa et al. | |
| 2009/0273096 A1 | 11/2009 | Hiew et al. | |
| 2010/0133673 A1 | 6/2010 | Chen et al. | |
| 2010/0244238 A1 | 9/2010 | Yoshikawa et al. | |
| 2010/0314740 A1* | 12/2010 | Choi | H01L 25/105 257/686 |
| 2011/0127671 A1 | 6/2011 | Yoshikawa et al. | |
| 2012/0262992 A1 | 10/2012 | Ayukawa et al. | |
| 2013/0134607 A1 | 5/2013 | Gillingham | |
| 2014/0008796 A1 | 1/2014 | Choi | |
| 2014/0197526 A1* | 7/2014 | Yoo | H01L 25/105 257/676 |
| 2014/0239514 A1 | 8/2014 | Haba et al. | |
| 2015/0311142 A1* | 10/2015 | Sekar | H01L 21/823475 257/499 |
| 2015/0311186 A1* | 10/2015 | Ye | H01L 24/85 257/777 |
| 2015/0364179 A1* | 12/2015 | Yoko | G11C 5/04 365/230.03 |
| 2015/0371968 A1 | 12/2015 | Haba et al. | |
| 2016/0218088 A1* | 7/2016 | McElrea | H01L 24/24 |
| 2016/0260671 A1 | 9/2016 | Haba et al. | |
| 2016/0293264 A1* | 10/2016 | Al-Shamma | G11C 5/14 |
| 2017/0358564 A1 | 12/2017 | Lee et al. | |
| 2018/0102344 A1* | 4/2018 | Ramachandra | H01L 25/18 |
| 2018/0130781 A1* | 5/2018 | Kang | H01L 24/48 |
| 2018/0350785 A1* | 12/2018 | Fong | H01L 25/50 |
| 2019/0035705 A1 | 1/2019 | Mao | |
| 2019/0043836 A1 | 2/2019 | Fastow et al. | |
| 2019/0051627 A1 | 2/2019 | She | |
| 2019/0067248 A1 | 2/2019 | Yoo et al. | |
| 2019/0103409 A1 | 4/2019 | Xu et al. | |
| 2019/0221557 A1 | 7/2019 | Kim et al. | |
| 2019/0252361 A1 | 8/2019 | Nishida | |
| 2019/0269187 A1* | 9/2019 | Buongiorno | B63C 11/04 |
| 2020/0098727 A1 | 3/2020 | Mallik et al. | |
| 2020/0227387 A1* | 7/2020 | Xu | H01L 24/48 |
| 2020/0321324 A1* | 10/2020 | Sano | H01L 24/48 |
| 2021/0104479 A1* | 4/2021 | Park | H01L 25/0657 |
| 2021/0104493 A1* | 4/2021 | Vodrahalli | H01L 25/0657 |
| 2021/0233881 A1* | 7/2021 | Said | H01L 24/08 |
| 2021/0233900 A1* | 7/2021 | Kim | H01L 25/50 |
| 2021/0249382 A1* | 8/2021 | Jeong | H01L 25/18 |

OTHER PUBLICATIONS

Zhou, F. et al., "Stacked Die Assembly Including Double-Sided Inter-Die Bonding Connections and Methods of Forming the Same," U.S. Appl. No. 16/886,221, filed May 28, 2020.
U.S. Appl. No. 16/231,752, filed Dec. 24, 2018, SanDisk Technologies LLC.
U.S. Appl. No. 16/249,423, filed Jan. 16, 2019, SanDisk Technologies LLC.
U.S. Appl. No. 16/261,869, filed Jan. 30, 2019, SanDisk Technologies LLC.
U.S. Appl. No. 16/291,457, filed Mar. 4, 2019, SanDisk Technologies LLC.
U.S. Appl. No. 16/291,504, filed Mar. 4, 2019, SanDisk Technologies LLC.
U.S. Appl. No. 16/291,577, filed Mar. 4, 2019, SanDisk Technologies LLC.
U.S. Appl. No. 16/372,908, filed Apr. 2, 2019, SanDisk Technologies LLC.
U.S. Appl. No. 16/523,029, filed Jul. 26, 2019, SanDisk Technologies LLC.
U.S. Appl. No. 16/671,025, filed Oct. 31, 2019, SanDisk Technologies LLC.
USPTO Office Communication, Non-Final Office Action for U.S. Appl. No. 16/886,221, dated Jun. 24, 2021, 17 pages.

* cited by examiner

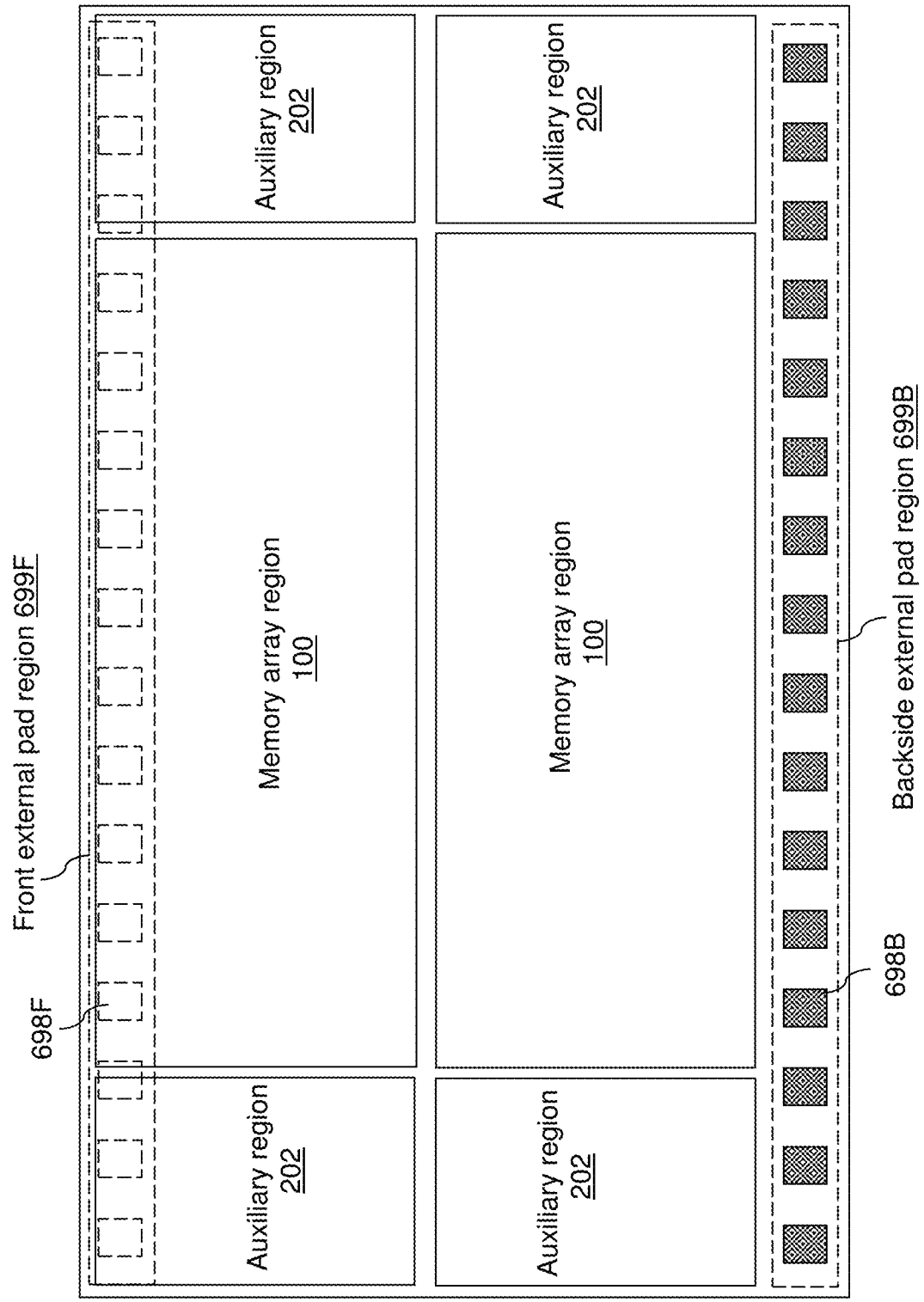

STACKED DIE ASSEMBLY INCLUDING DOUBLE-SIDED INTER-DIE BONDING CONNECTIONS AND METHODS OF FORMING THE SAME

FIELD

The present disclosure relates generally to the field of semiconductor devices, and particularly to a stacked die assembly including double-sided inter-die bonding connections and methods for forming the same.

BACKGROUND

A plurality of semiconductor dies can be stacked together to form a stacked die assembly. Power signals can be transmitted through each of the semiconductor dies in the stacked die assembly. However, the power signals carry high voltages, and routing the power signals in proximity to a logic circuit including noise sensitive devices, such as sense amplifiers, can increase the noise level in the logic circuit. Further, as the number of semiconductor dies in a stacked die assembly increases, the number of inter-die electrical connections increases.

SUMMARY

According to an aspect of the present disclosure, a structure including a stacked die assembly is provided. The stacked die assembly comprises: a vertical stack of multiple bonded units, wherein each bonded unit comprises a memory die including memory-side inter-die bonding pads and memory-side external bonding pads that are located on opposite major surfaces of the memory die, and a logic die including a logic circuit configured to control operation of the memory die and including logic-side inter-die bonding pads and logic-side external bonding pads that are located on opposite major surfaces of the logic die, wherein the logic-side inter-die bonding pads are bonded to a respective one of the memory-side inter-die bonding pads, and wherein the memory-side external bonding pads and the logic-side external bonding pads comprise a set of upward-facing external bonding pads having physically exposed surfaces that face upward and a set of downward-facing external bonding pads having physically exposed surfaces that face downward; a first set of bonding wires connecting upward-facing external bonding pads; and a second set of bonding wires connecting downward-facing external bonding pads.

According to another aspect of the present disclosure, a method of forming a structure including a stacked die assembly is provided. The method comprises: providing multiple bonded units, wherein each bonded unit comprises a memory die including memory-side inter-die bonding pads and memory-side external bonding pads that are located on opposite major surfaces of the memory die, and comprises a logic die including a logic circuit configured to control operation of the memory die and including logic-side inter-die bonding pads and logic-side external bonding pads that are located on opposite major surfaces of the logic die; forming a vertical stack of the multiple bonded units by attaching the multiple bonded units to each other such that the memory-side external bonding pads and the logic-side external bonding pads of the multiple bonded units form a set of upward-facing external bonding pads having physically exposed surfaces that face upward and a set of downward-facing external bonding pads having physically exposed surfaces that face downward; forming a first set of bonding wires that connect a respective pair of upward-facing external bonding pads of the set of upward-facing external bonding pads; and forming a second set of bonding wires that connect a respective pair of downward-facing external bonding pads of the set of downward-facing external bonding pads.

According to yet another aspect of the present disclosure, a structure including a stacked die assembly is provided. The stacked die assembly comprises: a vertical stack of multiple bonded units, wherein each bonded unit comprises a respective front-side semiconductor die including front-side external bonding pads and a respective backside semiconductor die including backside external bonding pads, wherein the respective backside semiconductor die is bonded to the respective front-side semiconductor die, and wherein the front-side external bonding pads of each bonded unit have physically exposed surfaces that face upward and the backside external bonding pads of each bonded unit have physically exposed surfaces that face downward; a first set of bonding wires connecting the front-side external bonding pads; and a second set of bonding wires connecting the backside external bonding pads.

According to still another aspect of the present disclosure, a method of forming a structure including a stacked die assembly is provided. The method comprises: providing multiple bonded units, wherein each bonded unit comprises a respective front-side semiconductor die including front-side external bonding pads and a respective backside semiconductor die including backside external bonding pads, wherein the backside semiconductor die is bonded to the respective front-side semiconductor die; forming a vertical stack of the multiple bonded units by attaching the multiple bonded units to each other such that the front-side external bonding pads of each bonded unit have physically exposed surfaces that face upward and the backside external bonding pads of each bonded unit have physically exposed surfaces that face downward; forming a first set of bonding wires that connect a respective pair of front-side external bonding pads; and forming a second set of bonding wires that connect a respective pair of backside external bonding pads.

BRIEF DESCRIPTION OF THE DRAWINGS

FIG. 9C is a partial see-through bottom-up view of the bonded unit of FIG. 9A.

DETAILED DESCRIPTION

Figure 1A:
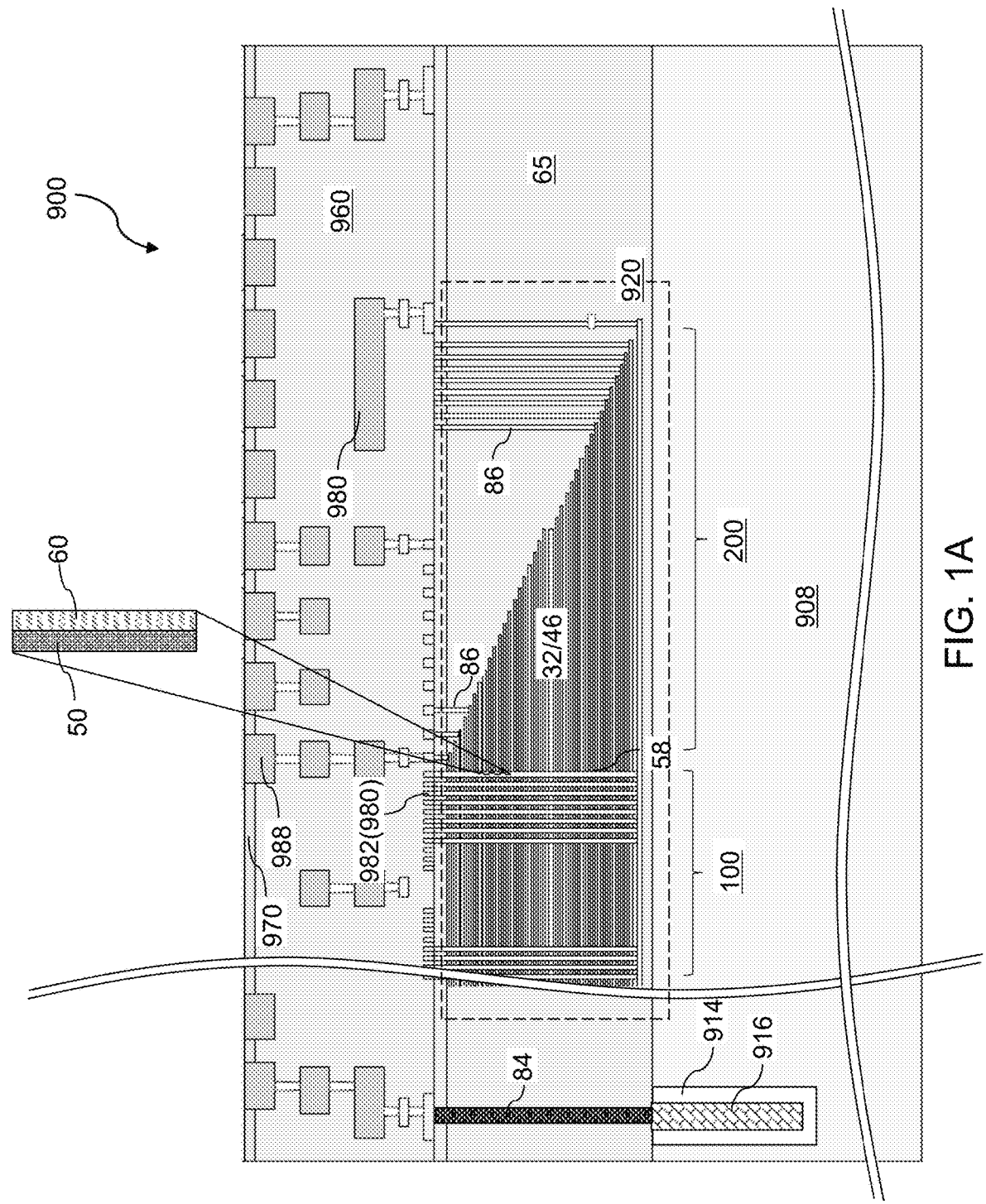
FIG. 1A is a schematic vertical cross-sectional view of a memory die after formation of memory-side inter-die bonding pads according to a first embodiment of the present disclosure.

The present disclosure is directed to a stacked die assembly including double-sided inter-die bonding connections and methods for forming the same, the various aspects of which are described in detail herebelow. Thus, a stacked die assembly including plural dies accommodates the inter-die electrical connections without taking up additional wafer space used by semiconductor devices, while minimizing noise and signal interference and parasitic coupling.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to $1.0$ S/m in the absence of electrical dopants therein, and is capable of producing a doped material having electrical conductivity in a range from $1.0$ S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays.

The substrate may include integrated circuits fabricated thereon, such as driver circuits for a memory device Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1B:
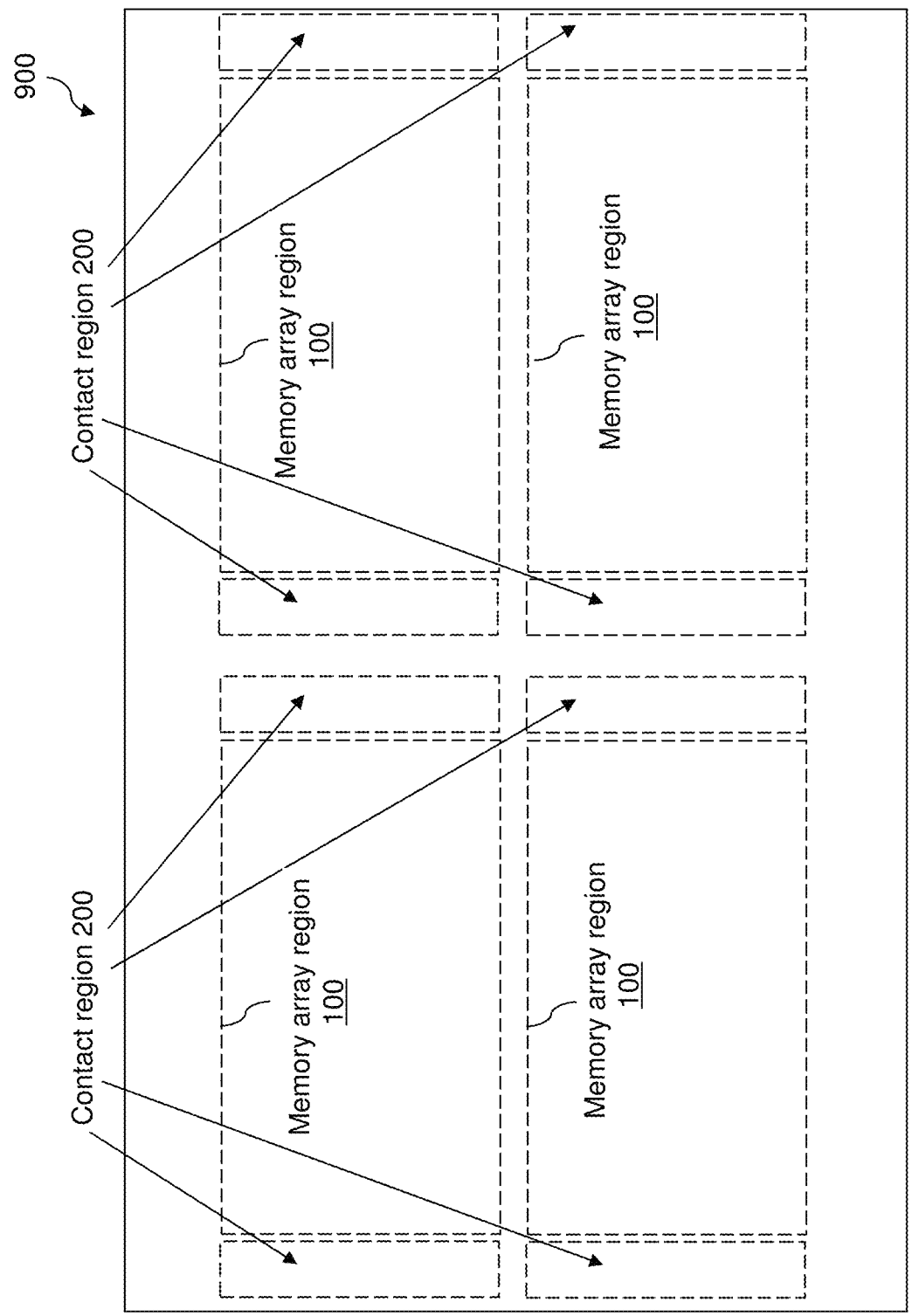
FIG. 1B is a layout of the memory die of FIG. 1A.

Referring to FIGS. 1A and 1B, a memory die 900 according to a first embodiment of the present disclosure is illustrated. The memory die 900 includes a memory-die substrate 908. The memory die 900 further includes memory-die semiconductor devices 920 overlying the memory-die substrate 908, memory-die dielectric material layers 960 overlying the memory-die semiconductor devices 920, and memory-die metal interconnect structures 980 embedded in the memory-die dielectric material layers 960. In one embodiment, the memory-die substrate 908 may be a commercially available silicon wafer having a thickness in a range from 500 microns to 1 mm. The memory die 900 may be provided in a wafer that includes a two-dimensional array of memory dies 900.

Generally, the memory-die semiconductor devices 920 may comprise any semiconductor memory device known in the art. In one embodiment, the memory die 900 may include a three-dimensional memory array, such as a three-dimensional NAND memory array. The three-dimensional memory device may include various device regions that contain various subsets of the memory-die semiconductor devices 920. For example, the memory die 900 can include multiple planes containing a respective three-dimensional memory array. Each plane can include a memory array region 100 and at least one contact region 200.

In one embodiment, substrate via cavities can be formed into an upper portion of the memory-die substrate 908. Each substrate via cavity can be filled with a dielectric spacer 914 and through-substrate via structure 916. Each through-substrate via structure 916 provides a vertically conductive path upon subsequent thinning of the memory-die substrate 908. Each through-substrate via structure 916 can be electrically connected to a respective memory-side metal interconnect structure 980 using a through-memory-level via structure 84. According to an aspect of the present disclosure, the through-substrate via structures 916 of the memory die 900 can be arranged as a row, or as a plurality of rows, that are proximal to one of the edges of the memory die 900. In one embodiment, the memory dies 900 can have straight edges, and the through-substrate via structures 916 of the memory die 900 can be arranged as a row, or as a plurality of rows, that are proximal to a straight edge of the memory die 900, and are laterally spaced from the straight edge by a uniform lateral offset distance.

In one embodiment, the memory-die semiconductor devices 920 may include a vertically alternating stack of insulating layers 32 and electrically conductive layers 46, and a two-dimensional array of memory openings vertically extending through the vertically alternating stack (32, 46). The electrically conductive layers 46 may comprise word lines of the three-dimensional NAND memory device. A memory opening fill structure 58 may be formed within each memory opening. Each memory opening fill structure 58 may include a memory film 50 and a vertical semiconductor channel 60 contacting the memory film 50. A portion of a vertical semiconductor channel 60 and a portion of a memory film 50 in a memory opening fill structure 58 are illustrated in an inset in FIG. 1A. The memory film 50 may include a blocking dielectric, a tunneling dielectric and a charge storage material located between the blocking and tunneling dielectric. The charge storage material may comprise charge trapping layer, such as a silicon nitride layer, or a plurality of discrete charge trapping regions, such as floating gates or discrete portions of a charge trapping layer. In this case, each memory opening fill structure 58 and adjacent portions of the electrically conductive layers 46 constitute a vertical NAND string. Alternatively, the memory opening fill structures 58 may include any type of non-volatile memory elements such as resistive memory elements, ferroelectric memory elements, phase change memory elements, etc. The memory opening fill structures 58 can be formed within a respective memory array region. A plurality of vertical NAND strings can be provided. Each vertical NAND string can include a vertical semiconductor channel 60 and a vertical stack of memory elements (e.g., portions of the memory film 50 or floating gates) located at levels of the electrically conductive layers 46.

The electrically conductive layers 46 may be patterned to provide a terrace region in which each overlying electrically conductive layer 46 has a lesser lateral extent than any underlying electrically conductive layer 46. Stepped dielectric material portions 65 may be formed around each vertically alternating stack (32, 46) to provide electrical isolation between neighboring vertically alternating stacks (32, 46). The stepped dielectric material portions 65 can be formed on stepped surfaces of a respective vertically alternating stack (32, 46). Layer contact via structures (e.g., word line and select gate layer contact via structures) 86 may be formed on the electrically conductive layers 46 in the terrace region to provide electrical connection to the electrically conductive layers 46. The layer contact via structures 86 can vertically extend through a respective stepped dielectric material portion 65, and can contact a respective one of the electrically conductive layers 46 (e.g., a word line or a select gate electrode).

Through-memory-level via structures 84 can be formed through the dielectric material portions onto a respective one of the through-substrate via structures 916. The memory-die dielectric material layers 960 and the memory-die metal interconnect structures 980 can be formed above the memory-die semiconductor devices 920 and the stepped dielectric material portions 65. The memory-die metal interconnect structures 980 include bit lines 982. Each bit line 982 electrically contacts a respective subset of the drain regions within the memory opening fill structures 58. The drain regions can contact the top end of a respective one of the vertical semiconductor channels 60. Thus, the bit lines 982 can be electrically connected to a respective subset of the plurality of vertical NAND strings. The memory-die metal interconnect structures 980 include interconnect metal lines and interconnect metal via structures.

Each of the memory-die dielectric material layers 960 may include a respective dielectric material such as undoped silicate glass, a doped silicate glass, organosilicate glass, silicon nitride, a dielectric metal oxide, or a combination thereof. A memory-die pad-level dielectric layer 970 may be provided on top of the memory-die dielectric material layers 960. The memory-die pad-level dielectric layer 970 may include a dielectric diffusion barrier layer such as a silicon nitride layer, or a first dielectric bonding material layer such as a silicon oxide layer that can be subsequently bonded to another dielectric bonding material layer of a logic die to be subsequently provided.

Pad cavities can be formed through the memory-die pad-level dielectric layer 970 and the upper portion of the memory-die dielectric material layers 960 over an underlying memory-side metal interconnect structure 980. The pad cavities can be filled with at least one conductive material to form the memory-side inter-die bonding pads 988. Memory-side inter-die bonding pads 988 are formed in the pad cavities through the memory-die pad-level dielectric layer 970 and the upper portion of the memory-die dielectric material layers 960. As used herein, a "inter-die bonding pad" refers to a bonding pad that is located in a die and configured for inter-die bonding through direct contact with another inter-die bonding pad located in another die.

Alternatively, the memory-side inter-die bonding pads 988 are formed on the memory-die metal interconnect structures 980 first, and the memory-die pad-level dielectric layer 970 can be formed over and around the memory-side inter-die bonding pads 988. In this case, the memory-die pad-level dielectric layer 970 can be subsequently planarized to expose the top surfaces of the memory-side inter-die bonding pads 988.

The at least one conductive material may be a metallic (i.e., metal or metal alloy) material that may be bonded to the same metallic material or to another metallic material by metal-to-metal or hybrid bonding. For example, each of the memory-side inter-die bonding pads 988 may include an optional metallic barrier liner that includes TiN, TaN, and/or WN, and a metal fill material portion that includes the metallic material that may be bonded to the same metallic material or to another metallic material by metal-to-metal bonding. For example, the metal fill material portion may include, and/or consist essentially of, any material selected from Cu, a copper alloy including copper at an atomic concentration greater than 70% (which may be greater than 90% and/or 95%), or a cobalt or nickel alloy, such as CoW, CoWP, CoMoP, NiW, and/or NiWP.

Each of the memory-side inter-die bonding pads 988 is surrounded by the memory-die pad-level dielectric layer 970, and contacts a respective underlying one of the memory-die metal interconnect structures 980. Each of the memory-side inter-die bonding pads 988 can be electrically connected to a respective node of the memory-die semiconductor devices 920. The memory-die metal interconnect structures 980 that are embedded in memory-die dielectric material layers 960 electrically connect a respective component of the memory devices 920 on the memory-die substrate 908 to a respective one of the memory-side inter-die bonding pads 988.

Figure 2A:
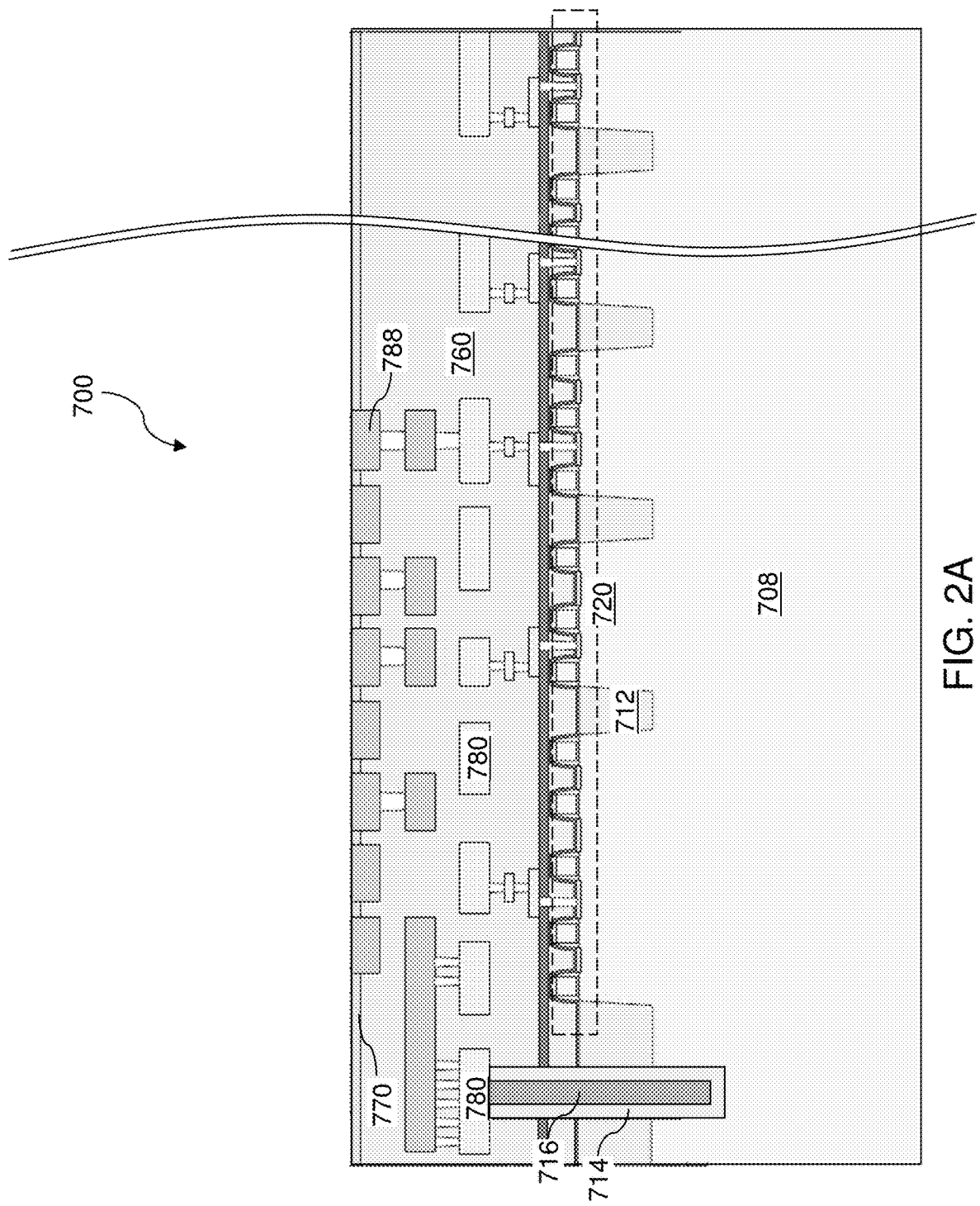
FIG. 2A is a schematic vertical cross-sectional view of a logic die after formation of logic-side inter-die bonding pads according to the first embodiment of the present disclosure.
Figure 2B:
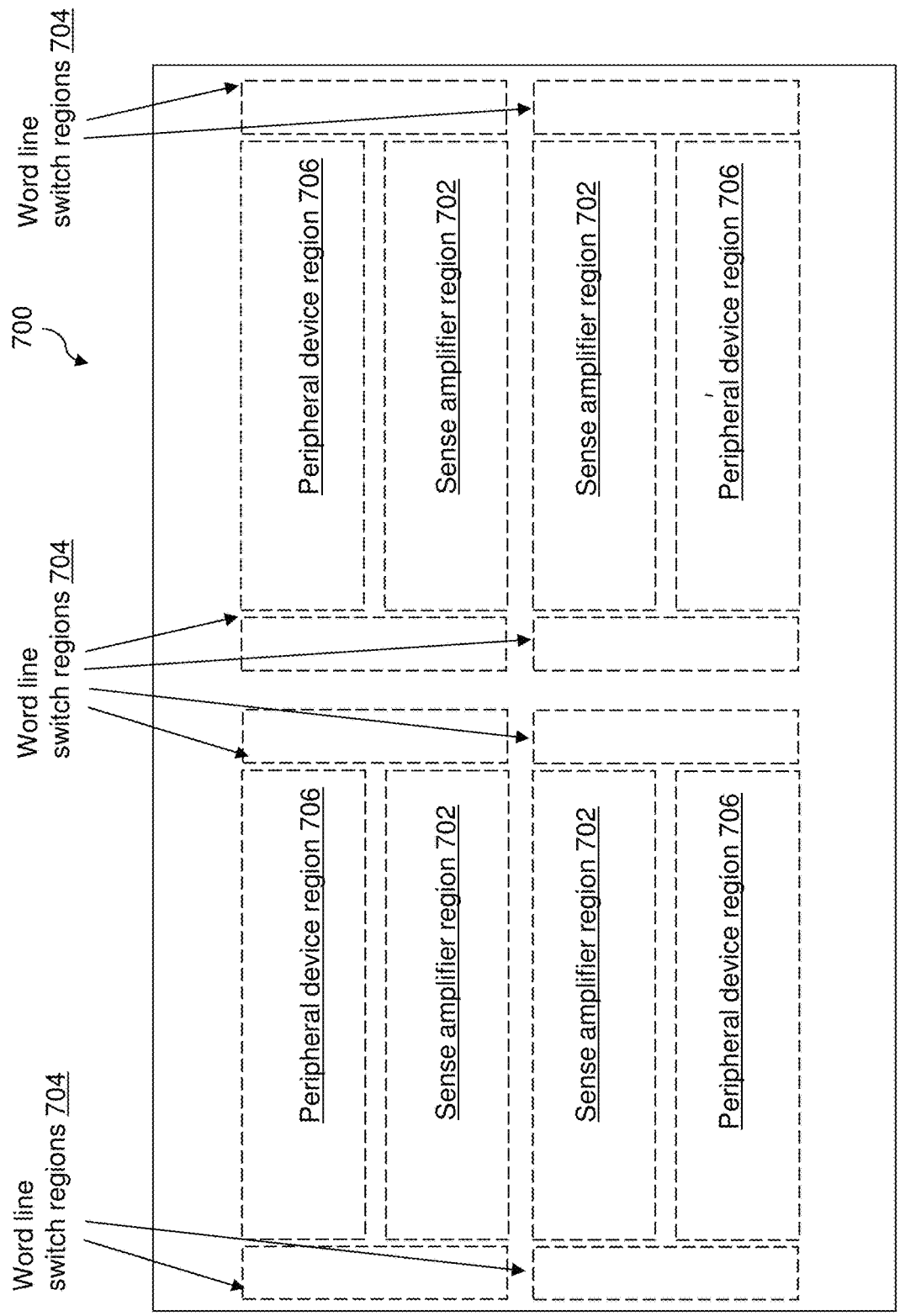
FIG. 2B is a layout of the memory die of FIG. 2A.

Referring to FIGS. 2A and 2B, a logic die 700 is illustrated. The logic die 700 includes a logic-die substrate 708, logic-die semiconductor devices 720 overlying the logic-die substrate 708, logic-die dielectric material layers 760 overlying the logic-die semiconductor devices 720, and logic-die metal interconnect structures 780 embedded in the logic-die dielectric material layers 760. In one embodiment, the logic-die semiconductor devices 720 may include at least one complementary metal oxide semiconductor (CMOS) circuitry including field effect transistors. In one embodiment, the logic-die substrate 708 may be a commercially available silicon substrate having a thickness in a range from 500 microns to 1 mm. The logic die 700 may be provided in a wafer that includes a two-dimensional array of logic dies 700.

Generally, the logic-die semiconductor devices may comprise any semiconductor device that may be operated in conjunction with the memory-side semiconductor devices 920 in the memory-side semiconductor die 900 to enable operation of the memory devices therein and/or to provide enhanced functionality. In one embodiment, the memory-side semiconductor die 900 may include a three-dimensional memory device including a three-dimensional array of memory elements, word lines (that may comprise a subset of the electrically conductive lines 46), and bit lines 982, the logic-die semiconductor devices 720 of the logic die 700 may include at least one sense amplifier region 702, at least one word line switch region 704, and at least one peripheral device region 706. Each sense amplifier region 702 includes sense amplifiers and bit line drivers electrically connected to a respective one of the bit lines 982. Each bit line driver can include one or more bit line decoder circuits that decode the addresses for the bit lines 982 and bit line hook up/connection regions. The word line switch regions 704 include one or more word line driver circuits that drive the word lines 46 of a respective three-dimensional array of memory elements of the memory-side semiconductor die 900 and one or more word line decoder circuits that decode the addresses for the word lines 46. Each peripheral device region 706 includes charge pump circuits, bit line decoders, a source power supply circuit, a data buffer and/or latch, input/output control circuits, and/or any other semiconductor circuit that may be used to operate three-dimensional memory device 920 of the memory-side semiconductor die 900

Shallow trench isolation structures 712 may be formed in an upper portion of the logic-die substrate 708 by forming shallow trenches and by filling the shallow trenches with a dielectric material such as silicon oxide. The logic-die semiconductor devices 720 can include field effect transistors, resistors, diodes, capacitors, inductors, and/or any additional semiconductor devices known in the art. Logic-die dielectric material layers 760 embedding logic-die metal interconnect structures 780 can be formed over the logic-die semiconductor devices 720. In one embodiment, substrate via cavities can be formed into an upper portion of the memory-die substrate 908. Each substrate via cavity can be filled with a dielectric spacer 714 and through-substrate via structure 716. Each through-substrate via structure 716 provides a vertically conductive path upon subsequent thinning of the logic-die substrate 708. Top surfaces of the through-substrate via structures 716 may protrude above the top surface of the logic-die substrate 708 into the logic-die dielectric material layer 760, or may be coplanar with the top surface of the logic-die substrate 708. Each through-substrate via structure 708 can be electrically connected to a respective logic-die metal interconnect structure 780. According to an aspect of the present disclosure, the through-substrate via structures 716 of the logic die 700 can be arranged as a row, or as a plurality of rows, that are proximal to one of the edges of the logic die 700. In one embodiment, the logic dies 700 can have straight edges, and the through-substrate via structures 716 of the logic die 700 can be arranged as a row, or as a plurality of rows, that are proximal to a straight edge of the logic die 700, and are laterally spaced from the straight edge by a uniform lateral offset distance.

Each of the logic-die dielectric material layers 760 may include a respective dielectric material such as undoped silicate glass, a doped silicate glass, organosilicate glass, silicon nitride, a dielectric metal oxide, or a combination thereof. A logic-die pad-level dielectric layer 770 may be provided on top of the logic-die dielectric material layers 760. The logic-die pad-level dielectric layer 770 may include a dielectric diffusion barrier layer such as a silicon nitride layer, or a first dielectric bonding material layer such as a silicon oxide layer that can be subsequently bonded to another dielectric bonding material layer of a logic die to be subsequently provided.

Pad cavities can be formed through the logic-die pad-level dielectric layer 770 and the upper portion of the logic-die dielectric material layers 760 over an underlying logic-die metal interconnect structure 780. The pad cavities can be filled with at least one conductive material to form the logic-side inter-die bonding pads 788. Logic-side inter-die bonding pads 788 are formed in the pad cavities through the logic-die pad-level dielectric layer 770 and the upper portion of the logic-die dielectric material layers 760.

Alternatively, the logic-side inter-die bonding pads 788 are formed on the logic-die metal interconnect structures 780 first, and the logic-die pad-level dielectric layer 770 can be formed over and around the logic-side inter-die bonding pads 788. In this case, the logic-die pad-level dielectric layer 770 can be subsequently planarized to expose the top surfaces of the logic-side inter-die bonding pads 788.

The at least one conductive material may be a metallic (i.e., metal or metal alloy) material that may be bonded to the same metallic material or to another metallic material by metal-to-metal or hybrid bonding. For example, each of the logic-side inter-die bonding pads 788 may include an optional metallic barrier liner that includes TiN, TaN, and/or WN, and a metal fill material portion that includes the metallic material that may be bonded to the same metallic material or to another metallic material by metal-to-metal bonding. For example, the metal fill material portion may include, and/or consist essentially of, any material selected from Cu, a copper alloy including copper at an atomic concentration greater than 70% (which may be greater than 90% and/or 95%), or a cobalt or nickel alloy, such as CoW, CoWP, CoMoP, NiW, and/or NiWP.

Each of the logic-side inter-die bonding pads 788 is surrounded by the logic-die pad-level dielectric layer 770, and contacts a respective underlying one of the logic-die metal interconnect structures 780. Each of the logic-side inter-die bonding pads 788 can be electrically connected to a respective node of the logic-die semiconductor devices 720. The logic-die metal interconnect structures 780 that are embedded in logic-die dielectric material layers 760 electrically connect a respective logic device 720 on the logic-die substrate 708 to a respective one of the logic-side inter-die bonding pads 788.

Figure 3:
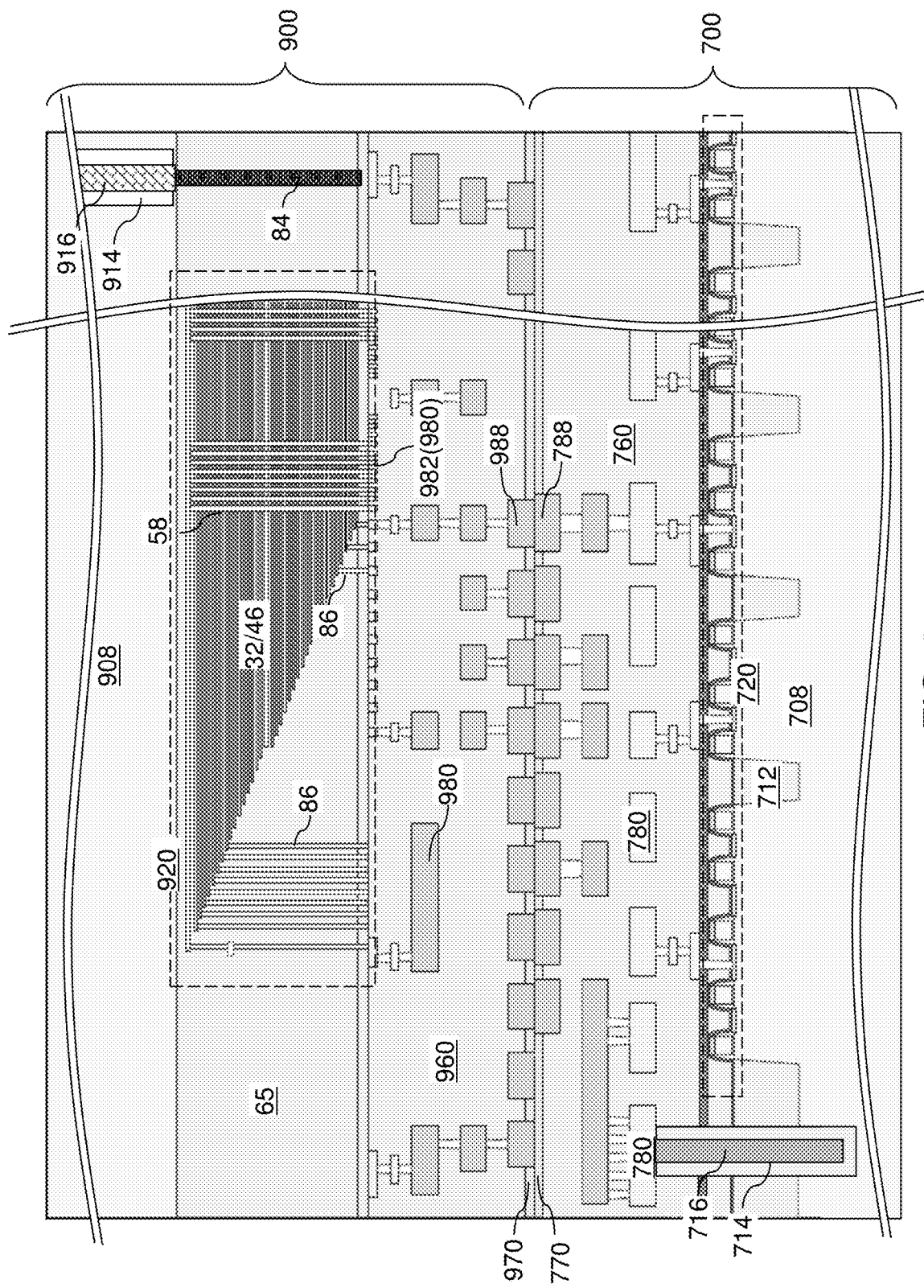
FIG. 3 is a vertical cross-sectional view of a bonded assembly of the memory die of FIG. 1A and the logic die of FIG. 2A.

Referring to FIG. 3, the memory-side semiconductor die 900 and the logic die 700 are oriented and aligned such that the memory-side inter-die bonding pads 988 face the logic-side inter-die bonding pads 788. The logic die 700 and the memory-side semiconductor die 900 are brought into contact such that each memory-side inter-die bonding pad 988 contacts a respective one of the logic-side inter-die bonding pads 788. In one embodiment, the pattern of the logic-side inter-die bonding pads 788 may be a mirror image of the pattern of the memory-side inter-die bonding pads 988 with optional differences in the size of inter-die bonding pads (988, 788) between the memory-side semiconductor die 900 and the logic die 700. In one embodiment, the memory-side inter-die bonding pads 988 and the corresponding logic-side inter-die bonding pads 788 may have the same size (i.e., lateral width). In another embodiment, the memory-side inter-die bonding pads 988 and the corresponding logic-side inter-die bonding pads 788 may have different sizes. In one embodiment, areal overlap between each facing pair of a memory-side inter-die bonding pad 988 and a logic-side inter-die bonding pad 788 may be at least 80%, and/or at least 90%, such as 90 to 100%, of the area of the smaller one of the memory-side inter-die bonding pad 988 and the logic-side inter-die bonding pad 788 within each mating pair.

A wafer including a plurality of memory die 900 and a wafer including a plurality of logic dies 700 may be bonded to each other using any suitable bonding method. For example, an anneal may be performed such that the logic-side inter-die bonding pads 788 may be bonded to the memory-side inter-die bonding pads 988 using metal-to-metal bonding, the memory-die pad-level dielectric layer 970 may be bonded to the logic-die pad-level dielectric layer 770 using dielectric bonding, or both the logic-side inter-die bonding pads 788 may be bonded to memory-side inter-die bonding pads 988 and the memory-die pad-level dielectric layer 970 may be bonded to the logic-die pad-level dielectric layer 770 using hybrid bonding.

The anneal temperature may be selected based on the composition of the respective materials, such as the logic-side inter-die bonding pads 788 and the memory-side inter-die bonding pads 988. For example, if the logic-side inter-die bonding pads 788 and the memory-side inter-die bonding pads 988 include metal fill portions that consist essentially of copper, the anneal temperature may be in a range from 150 degrees Celsius to 400 degrees Celsius. The bonded assembly of the memory die 900 and the logic die 700 comprises a bonded unit (900, 700). A plurality of bonded units (900, 700) can be formed. Generally, the memory die 900 and the logic die 700 within each bonded unit (900, 700) are bonded to each other through metal-to-metal bonding.

According to an aspect of the present disclosure, the layout of the through-substrate via structures 916 of the memory die 900 and the through-substrate via structures 716 of the logic die 700 can be selected such that the through-substrate via structures 916 of the memory die 900 are located on an opposite side of the through-substrate via structures 716 of the logic die 700 upon bonding. For example, the bonded unit (900, 700) can have a first pair of straight edges that are parallel to each other and laterally spaced apart by a second pair of straight edges, the through-substrate via structures 716 of the logic die 700 can be proximal to one of the first pair of straight edges, and the through-substrate via structures 916 of the memory die 900 can be proximal to another of the first pair of straight edges.

Figure 4:
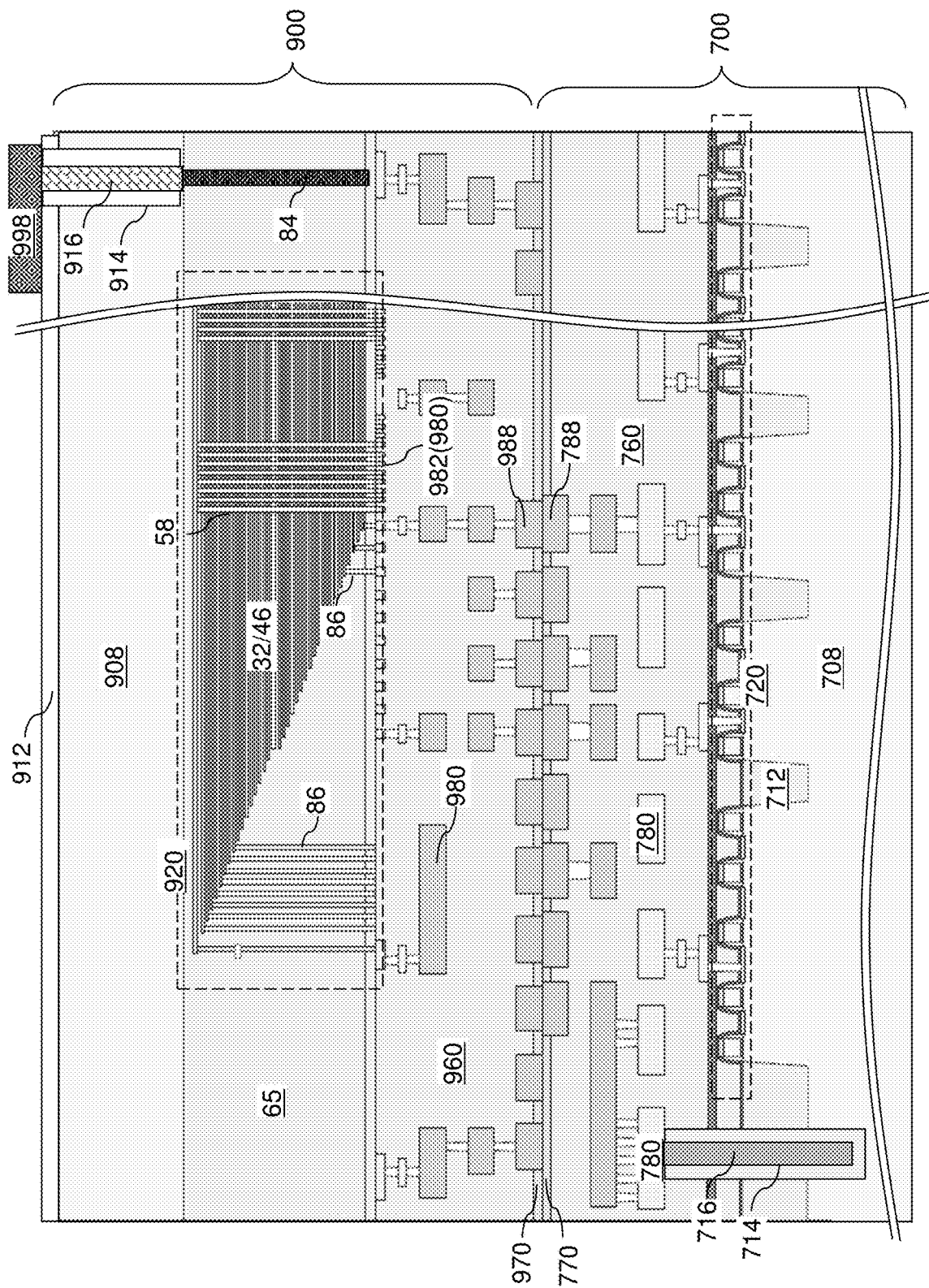
FIG. 4 is a vertical cross-sectional view of the bonded assembly of the memory die and the logic die after formation of memory-side external bonding pads according to the first embodiment of the present disclosure.

Referring to FIG. 4, the memory-die substrate 908 can be thinned by removing the backside portion of the memory-die substrate 908. Grinding, wet etching, dry etching, and/or polishing may be employed to remove the backside portion of the memory-die substrate 908. The through-substrate via structures 916 can be employed as planarization stopping structures. The memory-die substrate 908 can be selectively recessed relative to the through-substrate via structure 916 by an etch process such as a wet etch process. A dielectric material such as silicon oxide can be deposited over the recessed backside surface of the memory-die substrate, and can be planarized to physically expose backside surfaces of the through-substrate via structures 916. The remaining portion of the dielectric material comprises a memory-die backside dielectric layer 912.

An optional metallic liner and an underbump metallurgy (UBM) layer stack can be deposited on the backside surface of the memory-die backside dielectric layer 912. The metallic liner includes a material such as TiN, TaN, and/or WN, and may have a thickness in a range from 10 nm to 100 nm, although lesser and greater thicknesses may also be employed. The UBM layer stack includes a metallic material stack for bonding a solder ball thereupon. Exemplary UBM layer stacks include, but are not limited to, an Al/Ni/Au stack, an Al/Ni/Cu stack, a Cu/Ni/Au stack, a Cu/Ni/Pd stack, a Ti/Ni/Au stack, a Ti/Cu/Ni/Au stack, a Ti/W/Cu stack, a Cr/Cu stack, and a Cr/Cu/Ni stack. The thickness of the UBM layer stack may be in a range from 1 micron to 30 microns, such as from 3 microns to 10 microns, although lesser and greater thicknesses may also be employed.

The UBM layer stack and the optional metallic liner can be patterned, for example, by applying and patterning a photoresist layer over the UBM layer stack, and by transferring the pattern in the photoresist layer through the UBM layer stack and the optional metallic liner employing an etch process. The etch process may include an isotropic etch process or an anisotropic etch process. Each remaining portion of the UBM layer stack and the optional metallic liner comprises a bonding pad that can accommodate wire bonding. Each such bonding pad is herein referred to as a memory-side external bonding pad 998. The through-substrate via structures 916 within the memory die 900 vertically extend through the memory-die substrate 908, and are electrically connected to a respective one of the memory-side external bonding pads 998. The memory-side external bonding pads 998 can be located adjacent to a backside edge of the memory die 900, and can be arranged as a single row or plural rows, such as two rows or three rows. Each row of memory-side external bonding pads 998 can be parallel to the backside edge of the memory die 900. In one embodiment, the memory die 900 can have a rectangular horizontal cross-sectional shape, and the backside edge of the memory die 900 may be straight. In this case, each row of memory-side external bonding pads 998 can be arranged in a straight line. The region in which the at least one row of memory-side external bonding pads 998 is located is herein referred to as a memory-die backside external pad region 999.

Figure 5A:
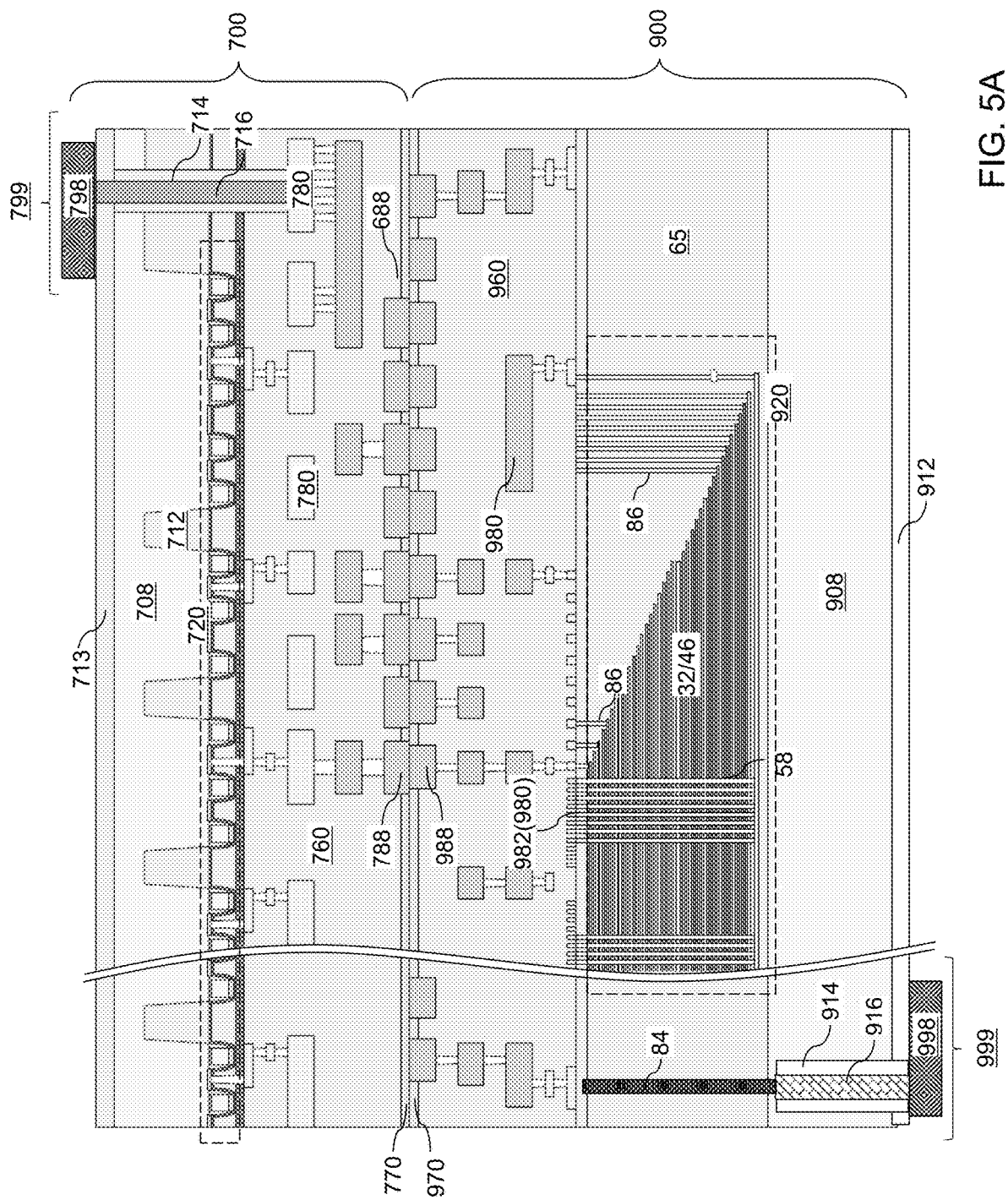
FIG. 5A is a vertical cross-sectional view of a region of a bonded unit of the memory die and the logic die after formation of logic-side external bonding pads according to the first embodiment of the present disclosure.
Figure 5B:
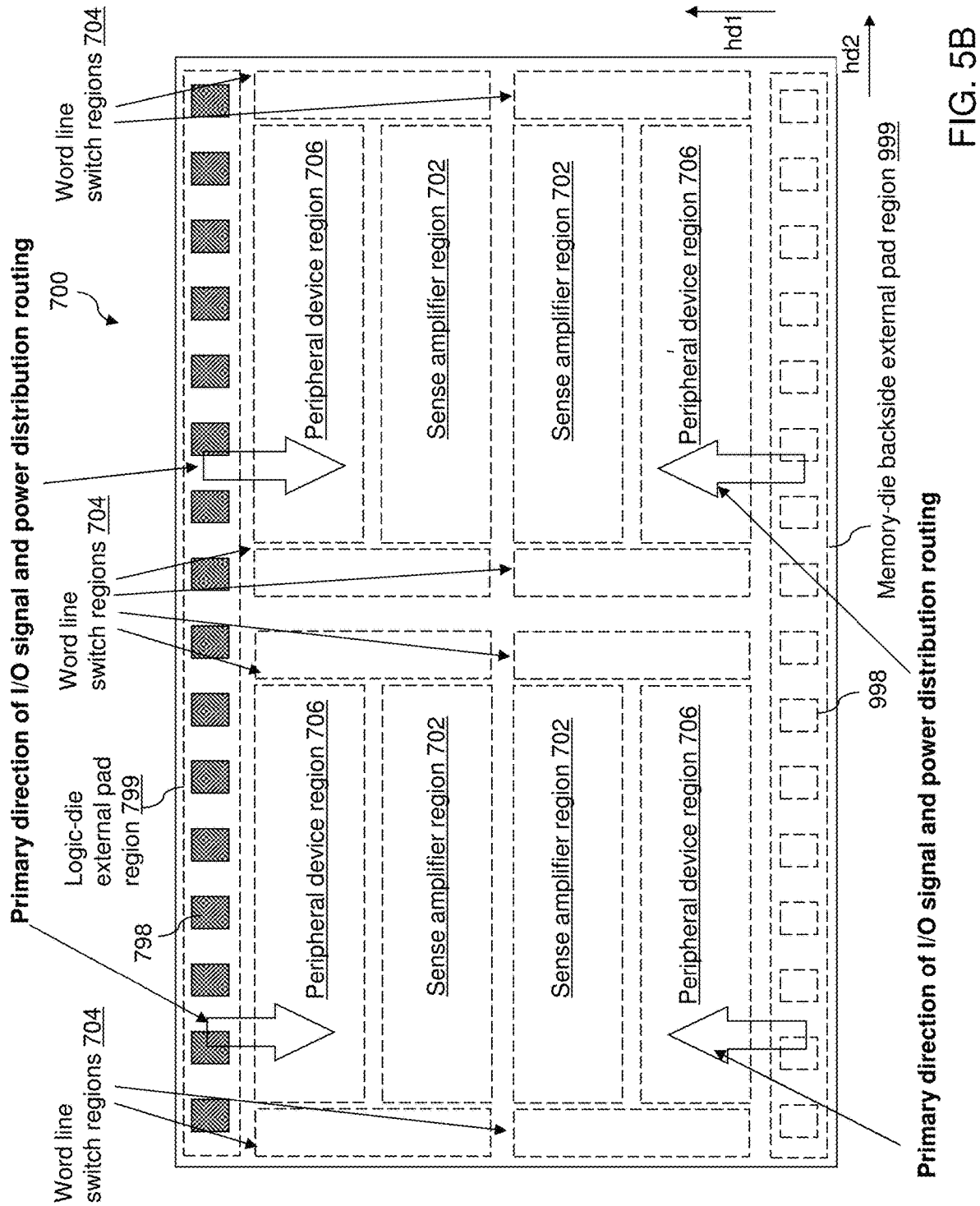
FIG. 5B is a plan view of the bonded unit of FIG. 5A.
Figure 6:
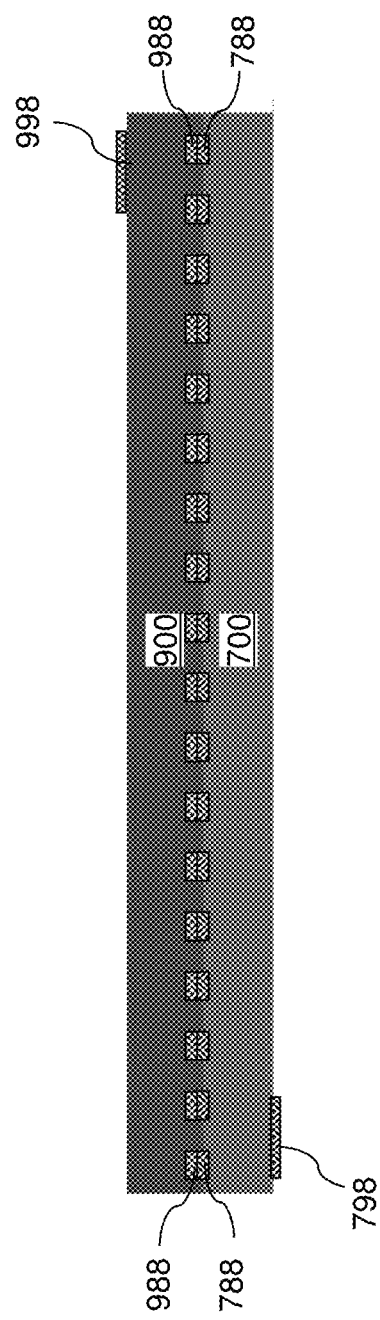
FIG. 6 is a vertical cross-sectional view of the bonded unit of FIGS. 5A and 5B according to the first embodiment of the present disclosure.

Referring to FIGS. 5A, 5B, and 6, the logic-die substrate 708 can be thinned by removing the backside portion of the logic-die substrate 708. Grinding, wet etching, dry etching, and/or polishing may be employed to remove the backside portion of the logic-die substrate 708. The through-substrate via structures 716 can be employed as planarization stopping structures. The logic-die substrate 708 can be selectively recessed relative to the through-substrate via structure 716 by an etch process such as a wet etch process. A dielectric material such as silicon oxide can be deposited over the recessed backside surface of the logic-die substrate, and can be planarized to physically expose backside surfaces of the through-substrate via structures 716. The remaining portion of the dielectric material comprises a logic-die backside dielectric layer 713.

An optional metallic liner and an underbump metallurgy (UBM) layer or layer stack can be deposited on the backside surface of the logic-die backside dielectric layer 713. The metallic liner includes a material such as TiN, TaN, and/or WN, and may have a thickness in a range from 10 nm to 100 nm, although lesser and greater thicknesses may also be employed. The UBM layer stack includes a metallic material stack for bonding a solder ball thereupon. Exemplary UBM layers include Al or Al alloy layers, and exemplary UBM layer stacks include, but are not limited to, an Al/Ni/Au stack, an Al/Ni/Cu stack, a Cu/Ni/Au stack, a Cu/Ni/Pd stack, a Ti/Ni/Au stack, a Ti/Cu/Ni/Au stack, a Ti/W/Cu stack, a Cr/Cu stack, and a Cr/Cu/Ni stack. The thickness of the UBM layer stack may be in a range from 1 micron to 30 microns, such as from 3 microns to 10 microns, although lesser and greater thicknesses may also be employed.

The UBM layer stack and the optional metallic liner can be patterned, for example, by applying and patterning a photoresist layer over the UBM layer stack, and by transferring the pattern in the photoresist layer through the UBM layer stack and the optional metallic liner employing an etch process. The etch process may include an isotropic etch process or an anisotropic etch process. Each remaining portion of the UBM layer stack and the optional metallic liner comprises a bonding pad that can accommodate wire bonding. Each such bonding pad is herein referred to as a logic-side external bonding pad 798. The through-substrate via structures 716 within the logic die 700 vertically extend through the logic-die substrate 708, and are electrically connected to a respective one of the logic-side external bonding pads 798. The logic-side external bonding pads 798 can be located adjacent to a backside edge of the logic die 700, and can be arranged as a single row, two rows, or three rows. Each row of logic-side external bonding pads 798 can be parallel to the backside edge of the logic die 700. In one embodiment, the logic die 700 can have a rectangular horizontal cross-sectional shape, the backside edge of the logic die 700 may be straight. In this case, each row of logic-side external bonding pads 798 can be arranged in a straight line. The region in which the at least one row of logic-side external bonding pads 798 is located is herein referred to as a logic-die backside external pad region 799.

The logic-die backside external pad region is located on an opposite side of the memory-die backside external pad region in a plan view (such as the view of FIG. 5B) along a direction that is perpendicular to the interface between the memory die 900 and the logic die 700. In one embodiment, the memory-die backside external pad region 999 can be laterally spaced apart from the logic-die backside external pad region 799 along a first horizontal direction hd1 (e.g., bit line direction). The logic-side external bonding pads 798 can be arranged in a row (or multiple rows) that laterally extends along a second horizontal direction hd2 that is parallel to an edge of the bonded unit (900, 700), and the memory-side external bonding pads 998 can be arranged in a row (or multiple rows) that laterally extend along the second horizontal direction hd2 (e.g., word line direction) and located on an opposite side of the logic-die backside external pad region 799. The second horizontal direction hd2 can be perpendicular to the first horizontal direction hd1.

The primary direction of input/output signals and power distribution routing within the memory die 900 and the logic die 700 can be along the first horizontal direction hd1, and the second direction of the input/output signals and power distribution routing within the memory die 900 and the logic die 700 can be along the second horizontal direction hd2. As shown in FIG. 5B, in a bonded units (900, 700) containing four memory plane memory dies 900, the peripheral device regions 706 are located adjacent to the sides (i.e., edges) of the logic dies 700 of the bonded units (900, 700) containing the respective backside external pad regions (999, 799), while the sense amplifier regions 702 are located in the middle of the logic dies 700 of the bonded units (900, 700) between the peripheral device regions 706 and the edge word line switch regions 704. Thus, the power signals are routed directly from the respective backside external pad regions (999, 799) to the peripheral device regions (e.g., to the charge pump circuits located in the peripheral device regions) 706 without passing through the sense amplifier regions 702. This means that the interconnect structures 780 electrically connecting the respective backside external pad regions (999, 799) to the peripheral device regions 706 can be made shorter which decreases their resistance, which increases the charge pump power efficiency. Furthermore, such interconnect structures 780 do not have to be routed around the bonding pads 788 in the sense amplifier region 702 and do not generate noise in the sense amplifier region 702 which interferes with sense amplifier operation.

In one embodiment, the through-substrate via structures 916 in the memory die 900 vertically extend through the memory-die substrate 908, and are electrically connected to a respective one of the memory-side external bonding pads 998. Memory-die metal interconnect structures 980 are embedded in the memory-die dielectric material layers 960, and electrically connect a respective memory device 920 on the memory-die substrate 908 to a respective one of the memory-side inter-die bonding pads 988.

In one embodiment, the through-substrate via structures 716 in the logic die 700 vertically extend through the logic-die substrate 708, and are electrically connected to a respective one of the logic-side external bonding pads 798. Logic-die metal interconnect structures 780 are embedded in the logic-die dielectric material layers 760, and electrically connect a respective logic device 720 on the logic-die substrate 708 to a respective one of the logic-side inter-die bonding pads 788.

Multiple bonded units (900, 700) can be formed. Each bonded unit (900, 700) comprises a memory die 900 including memory-side inter-die bonding pads 988 and memory-side external bonding pads 998 that are located on opposite major surfaces of the memory die 900. Further, each bonded unit (900, 700) comprises a logic die 700, which includes a logic circuit configured to control operation of the memory die 900, and logic-side inter-die bonding pads 788 and logic-side external bonding pads 798 that are located on opposite major surfaces of the logic die 700. In one embodiment, each bonded unit (900, 700) can be provided by bonding a respective logic die 700 and a respective memory die 900 such that logic-side inter-die bonding pads 788 of the respective logic die 700 are bonded to a respective one of memory-side inter-die bonding pads 988 of the respective memory die 900.

In one embodiment, a plurality of bonded units (900, 700) may be formed by bonding a wafer including a plurality of memory dies 900 to a wafer including a plurality of logic dies 700. In this case, the bonded assembly of the two wafers can be diced along dicing channels to provide multiple bonded units (900, 700).

Figure 7:
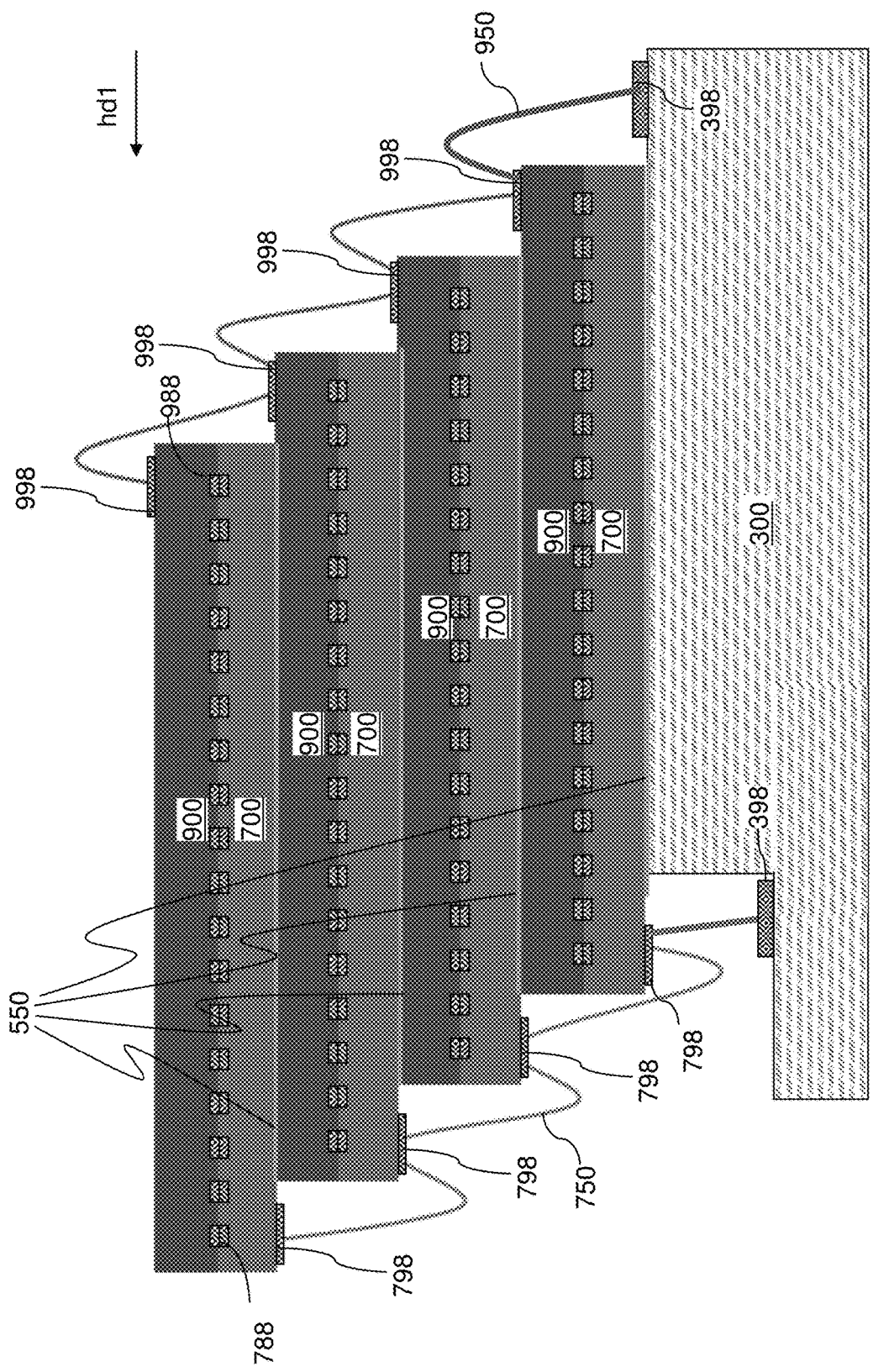
FIG. 7 is a vertical cross-sectional view of a first exemplary structure including a vertical stack of multiple bonded units and a mounting substrate after attaching bonding wires according to the first embodiment of the present disclosure.

Referring to FIG. 7, a first exemplary structure including a stacked die assembly according to the first embodiment of the present disclosure is illustrated. The stacked die assembly includes a vertical stack of the multiple bonded units (900, 700) formed by attaching vertically neighboring pairs of bonded units employing adhesive layers 550. In one embodiment, the stacked die assembly comprises a vertical stack of multiple bonded units (900, 700) and a mounting substrate (e.g., a printed circuit board or base of a package) 300 that are connected to each other by adhesive layers 550. Each vertically neighboring pair of bonded units (900, 700) can be attached to each other by a respective adhesive layer 550. The mounting substrate 300 can be attached to the vertical stack of the multiple bonded units (900, 700) employing an additional adhesive layer 550. Alternatively, other attachment methods, such as clamps, packages or bonding layers may be used instead of or in addition to the adhesive layers 550.

Generally, a vertical stack of the multiple bonded units (900, 700) can be formed by attaching the multiple bonded units (900, 700) to each other such that the memory-side external bonding pads 998 and the logic-side external bonding pads 798 of the multiple bonded units (900, 700) form a set of upward-facing external bonding pads having physically exposed surfaces that face upward and a set of downward-facing external bonding pads having physically exposed surfaces that face downward with respect to the bonding side of the mounting substrate 300. For example, the bonded units (900, 700) can be staggered such that the memory-side external bonding pads 998 are physically exposed and the logic-side external bonding pads 798 are physically exposed. In one embodiment, the memory-side external bonding pads 998 may be physically exposed to face upward and the logic-side external bonding pads 798 may be physically exposed to face downward with respect to the bonding side of the mounting substrate 300. In another embodiment, the memory-side external bonding pads 998 may be physically exposed to face downward and the logic-side external bonding pads 798 may be physically exposed to face upward with respect to the bonding side of the mounting substrate 300.

A first set of bonding wires 950 can connect a respective pair of upward-facing external bonding pads of the set of upward-facing external bonding pads (which may be memory-side external bonding pads 998 or logic-side external bonding pads 798). A second set of bonding wires 750 can connect a respective pair of downward-facing external bonding pads of the set of downward-facing external bonding pads (which may be memory-side external bonding pads 998 or logic-side external bonding pads 798).

In one embodiment, the multiple bonded units (900, 700) can be staggered such that each overlying bonded unit (900, 700) is laterally offset along the first horizontal direction hd1 relative to an underlying bonded unit (900, 700). The first horizontal direction hd1 is the direction along which the logic-die external pad region of the logic die 700 is laterally spaced apart from the memory-side external pad region of the memory die 900.

The vertical stack of the multiple bonded units (900, 700) can be electrically connected to the mounting substrate 300 by attaching additional bonding wires (950, 750) to bonding pads 398 located on the mounting side of the mounting substrate 300 and to external bonding pads (998, 798) of a most proximal bonded unit (900, 700) of the vertical stack of the multiple bonded units (900, 700).

In one embodiment, the multiple bonded units (900, 700) can be attached to each other such that each upward-facing external bonding pad within the stacked die assembly does not have an areal overlap with any overlying bonded unit within the stacked die assembly in a plan view along a direction (such as a vertical direction) along which the bonded units are stacked, each downward-facing external bonding pad within the stacked die assembly does not have an areal overlap with any underlying bonded unit within the stacked die assembly in the plan view.

Referring to FIGS. 1A-7 and according to various embodiments of the present disclosure, a structure including a stacked die assembly (900, 700, 300, 950, 750). The stacked die assembly (900, 700, 300, 950, 750) comprises a vertical stack of multiple bonded units (900, 700). Each bonded unit (900, 700) comprises a memory die 900 including memory-side inter-die bonding pads 988 and memory-side external bonding pads 998 that are located on opposite major surfaces of the memory die 900. Each bonded unit (900, 700) also comprises a logic die 700 including a logic circuit configured to control operation of the memory die 900 and including logic-side inter-die bonding pads 788 and logic-side external bonding pads 798 that are located on opposite major surfaces of the logic die 700. The logic-side inter-die bonding pads 788 are bonded to a respective one of the memory-side inter-die bonding pads 988. The memory-side external bonding pads 998 and the logic-side external bonding pads 798 comprise a set of upward-facing external bonding pads having physically exposed surfaces that face upward and a set of downward-facing external bonding pads having physically exposed surfaces that face downward. A first set of bonding wires 950 connects upward-facing external bonding pads, and a second set of bonding wires 750 connect downward-facing external bonding pads.

As used herein, the major surfaces of a die are opposite to each other, where one major surface contains the external bonding pads and the other major surface contains the inter-die bonding pads which are bonded to the inter-die bonding pads of the other die of the bonded unit (900, 700). One major surface may be considered a "lower" major surface if it points "downward" toward the mounting substrate 3000, while the other major surface may be considered an "upper" major surface if it points "upward" away from the mounting substrate 3000. However, it should be noted that "upward" and "downward" do not necessarily align with the directions of "away from" and "toward" the ground because the bonded unit may be positioned sideways or "upside down" (with the mounting substrate 3000 above the bonded units) in an electronic device. Likewise, the electronic device may be positioned in any direction with respect to the ground.

In one embodiment, each vertically neighboring pair of bonded units (900, 700) comprises an overlying bonded unit (i.e., an upper bonded unit of a memory die 900 and a logic die 700) and an underlying bonded unit (i.e., an additional bonded unit of an additional memory die 900 and an additional logic die 700) with respect to the mounting substrate 3000 location. The overlying bonded unit is laterally offset along a first horizontal direction hd1 relative to the underlying bonded unit. A horizontal direction is parallel to a major surface of a die. In one embodiment, memory-side external bonding pads 998 within each memory die 900 are laterally offset from an edge of the memory die 900 with a uniform lateral offset distance along the first horizontal direction hd1, and the edge of the memory die 900 laterally extends along a second horizontal direction hd2 that is perpendicular to the first horizontal direction hd1. In one embodiment, logic-side external bonding pads 798 within each logic die 700 are laterally offset from an edge of the logic die 700 with a uniform lateral offset distance, and the edge of the logic die 700 laterally extends along a second horizontal direction hd2 that is perpendicular to the first horizontal direction hd1.

In one embodiment, each upward-facing external bonding pad (998 or 798) within the stacked die assembly (900, 700, 300, 950, 750) does not have an areal overlap with any overlying bonded unit (900, 700) within the stacked die assembly in a plan view along a direction along which the bonded units (900, 700) are stacked (i.e., the vertical direction); and each downward-facing external bonding pad (998 or 798) within the stacked die assembly (900, 700, 300, 950, 750) does not have an areal overlap with any underlying bonded unit (900, 700) within the stacked die assembly (900, 700, 300, 950, 750) in the plan view.

In one embodiment, the set of upward-facing external bonding pads (998 or 798) comprises the memory-side external bonding pads 998 and the set of downward-facing external bonding pads comprises the logic-side external bonding pads 798, or the set of downward-facing external bonding pads (998 or 798) comprises the logic-side external bonding pads 798 and the set of downward-facing external bonding pads (998 or 798) comprises the memory-side external bonding pads 998.

In one embodiment, each vertically neighboring pair of bonded units (900, 700) is attached to each other by a respective adhesive layer 550. The vertical stack of multiple bonded units (900, 700) can be mounted to a mounting substrate 300 by an additional adhesive layer 550. Additional bonding wires (950, 750) can provide electrical connection between external bonding pads (998, 798) of a most proximal bonded unit (900, 700) among the multiple bonded units (900, 700) and bonding pads located on the mounting substrate 300.

In one embodiment, the logic-side inter-die bonding pads 788 are bonded to the respective one of the memory-side inter-die bonding pads 988 within each bonded unit (900, 700) by metal-to-metal bonding.

In one embodiment, at least one of the memory dies 900 comprises: a three-dimensional memory array located over a memory-die substrate 908; memory-die metal interconnect structures 980 embedded in memory-die dielectric material layers 960; and through-substrate via structures 916 vertically extending through the memory-die substrate 908 and electrically connected to a respective one of the memory-side external bonding pads 998. In one embodiment, the three-dimensional memory array comprises: a vertically alternating stack of insulating layers 32 and electrically conductive layers 46; a plurality of memory opening fill structures 58 each including a vertical semiconductor channel and a vertical stack of memory elements (e.g., portions of a memory film) located at levels of the electrically conductive layers 46; bit lines 982 electrically connected to a respective subset of the plurality of the memory opening fill structures 58; a stepped dielectric material portion 65 located on stepped surfaces of the alternating stack (32, 46); and layer contact via structures 86 vertically extending through the stepped dielectric material portion 65 and contacting a respective one of the electrically conductive layers 46.

In one embodiment, at least one of the logic dies 700 that is bonded to a respective one of the memory dies 900 comprises: a sense amplifier region 702 including sense amplifiers electrically connected to a respective one of the bit lines 982; and a peripheral device region 706 including a charge pump circuit. In one embodiment, the peripheral device region is located between the sense amplifier region 702 and the logic-side external bonding pads 798.

In one embodiment, at least one of the logic dies 700 comprises: through-substrate via structures 716 vertically extending through a logic-die substrate 708 and electrically connected to a respective one of the logic-side external bonding pads 798; and logic-die metal interconnect structures 780 embedded in logic-die dielectric material layers 760 and electrically connecting a respective logic device 720 on the logic-die substrate 708 to a respective one of the logic-side inter-die bonding pads 788.

Figure 8A:
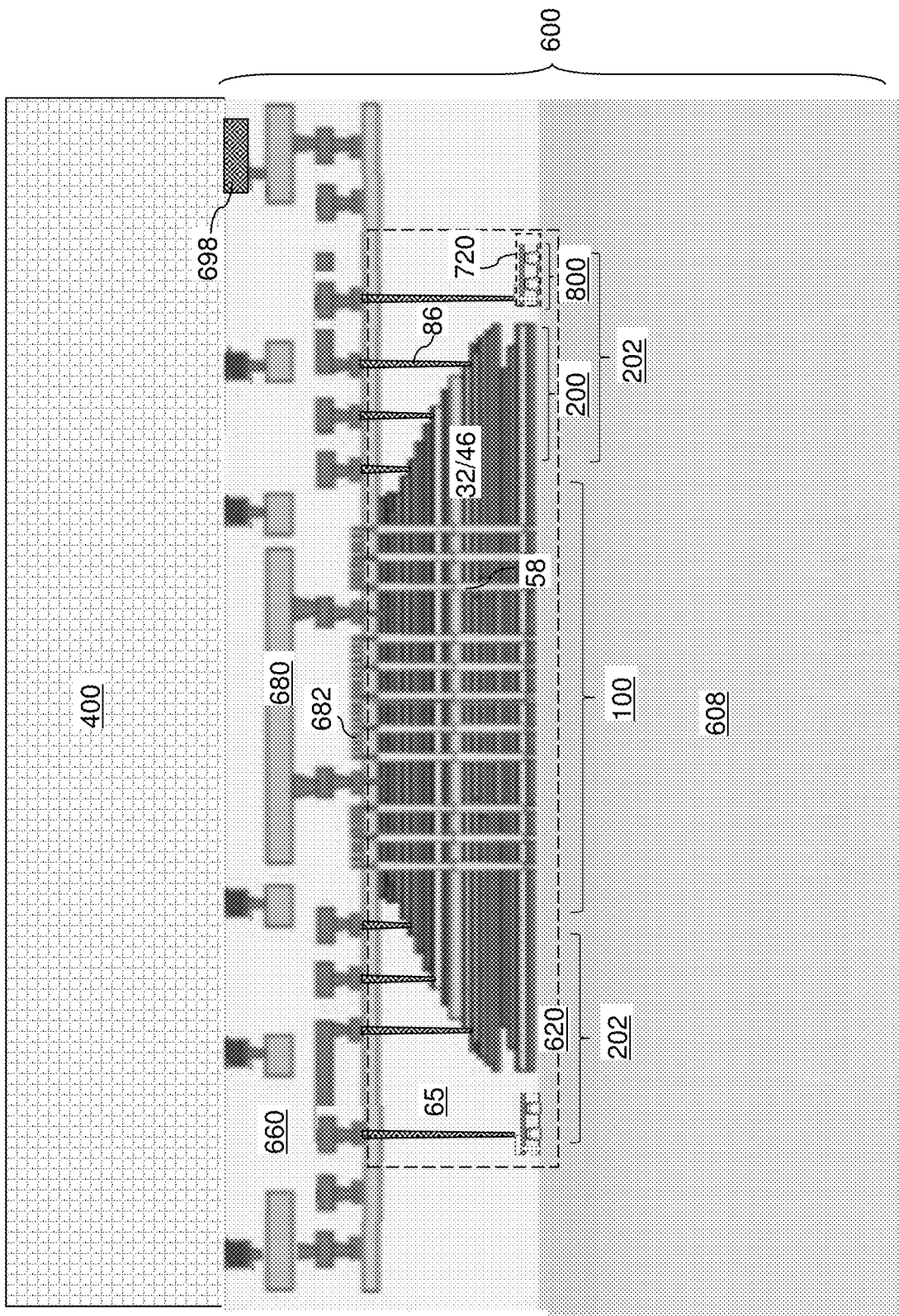
FIG. 8A is a vertical cross-sectional view of a memory die after attaching a handle substrate according to a second embodiment of the present disclosure.
Figure 8B:
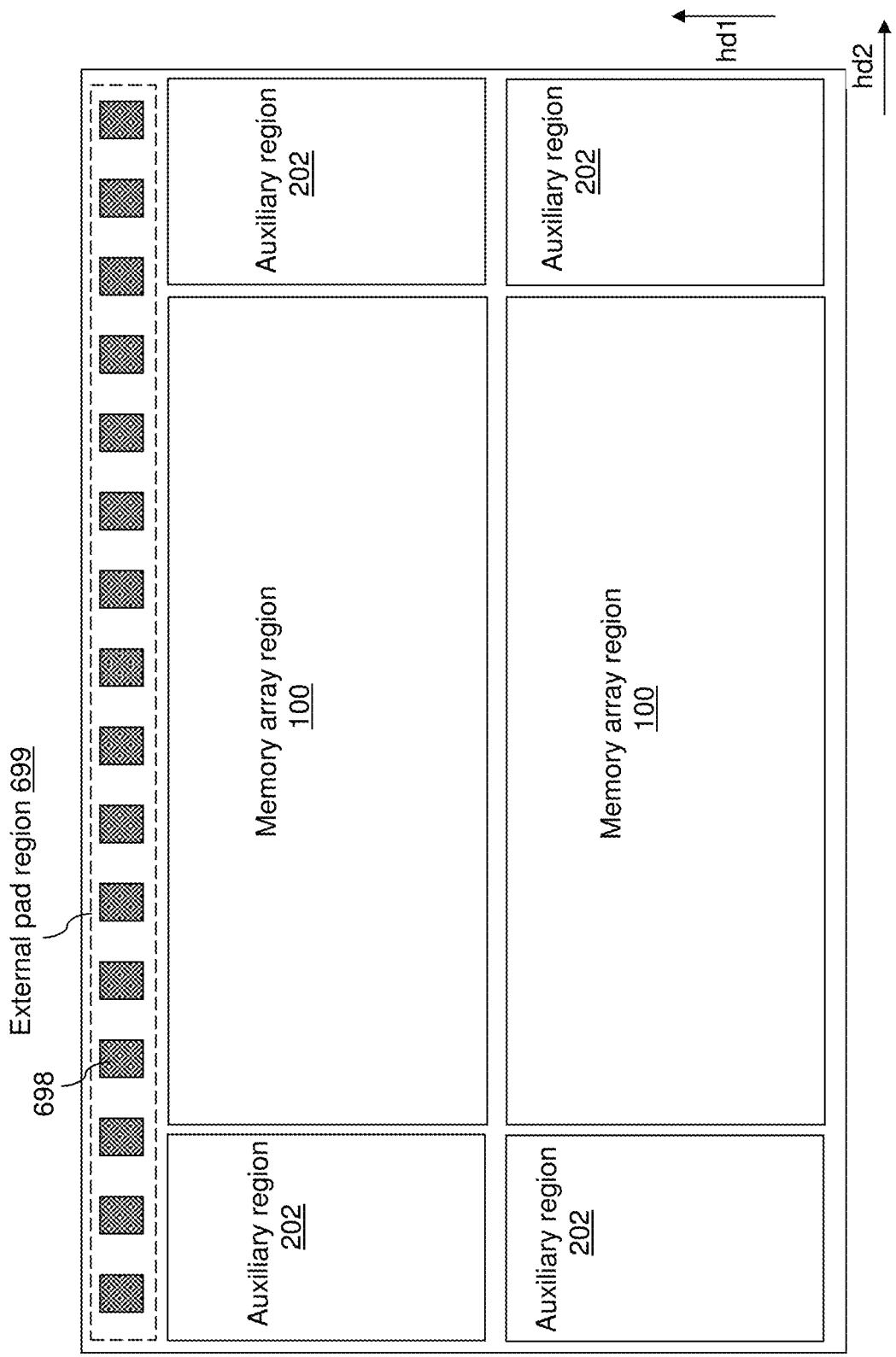
FIG. 8B is a plan view of the memory die of FIG. 8A.

Referring to FIGS. 8A and 8B, a semiconductor die 600 according to a second embodiment of the present disclosure is illustrated. The semiconductor die 600 of the second embodiment includes a substrate 608, which is also referred to as a first substrate. The semiconductor die 600 further includes semiconductor devices 620 overlying the substrate 608, dielectric material layers 660 overlying the semiconductor devices 620, and metal interconnect structures 680 embedded in the dielectric material layers 660. The metal interconnect structures 680 include bit lines 682. In one embodiment, the substrate 608 may be a commercially available silicon wafer having a thickness in a range from 500 microns to 1 mm. The semiconductor die 600 may be provided in a wafer that includes a two-dimensional array of memory dies 600. For example, the wafer may be a semiconductor wafer such as a silicon wafer.

Generally, the semiconductor devices 620 include memory devices and may optionally include logic devices. The semiconductor die 600 can include at least one memory array region 100 and at least one auxiliary region 202. The auxiliary regions 202 contains the connection region 200 (which may be the region 200 described above with respect to FIG. 1A) and optionally at least one logic device region 800. Each memory array region 100 includes a respective memory array (e.g., the memory-die semiconductor devices 920 described above). If present, then each logic device region 800 includes logic devices 720 described above for supporting operation of memory elements in a respective memory array region 100. In one embodiment, the logic device region 800 may be located next to the contact region 200 (e.g., in a CMOS next to memory array configuration), as shown in FIG. 8A. In an alternative embodiment, the logic device region 800 may be located under the memory array region 100 and under the contact region 200 (e.g., in a CMOS under memory array configuration). In another alternative embodiment, the logic device region 800 is not present on or over the substrate 608. Instead, the logic device region is present on a separate substrate, such as the mounting substrate 3000 described above with respect to the first embodiment (e.g., in a CMOS bonded to memory array configuration).

Each plane can include a memory array region 100 and at least one auxiliary region 202. For example, FIG. 8B illustrates a die containing two memory planes, each of which contains two auxiliary regions 202. However, other configurations may be used. Each memory array region 100 can include memory devices 920 that may be provided in a memory die 900 of the first embodiment. Each logic device region 800 (if present) can include logic devices 720 that may be provided in a logic die 700 of the first embodiment. For example, each memory array region 100 may include a three-dimensional memory array, such as a three-dimensional NAND memory array. The three-dimensional memory device may include various device regions that contain various subsets of the semiconductor devices 620.

In one embodiment, the semiconductor devices 620 may include a vertically alternating stack of insulating layers 32 and electrically conductive layers 46, and a two-dimensional array of memory openings vertically extending through the vertically alternating stack (32, 46). The electrically conductive layers 46 may comprise word lines of the three-dimensional NAND memory device. A memory opening fill structure 58 may be formed within each memory opening. Each memory opening fill structure 58 may include a memory film and a vertical semiconductor channel contacting the memory film. The memory film may include a blocking dielectric, a tunneling dielectric and a charge storage material located between the blocking and tunneling dielectric. The charge storage material may comprise charge trapping layer, such as a silicon nitride layer, or a plurality of discrete charge trapping regions, such as floating gates or discrete portions of a charge trapping layer. In this case, each memory opening fill structure 58 and adjacent portions of the electrically conductive layers 46 constitute a vertical NAND string. Alternatively, the memory opening fill structures 58 may include any type of non-volatile memory elements such as resistive memory elements, ferroelectric memory elements, phase change memory elements, etc.

The memory opening fill structures 58 can be formed within a respective memory array region. A plurality of vertical NAND strings can be provided. Each vertical NAND string can include a vertical semiconductor channel and a vertical stack of memory elements (e.g., portions of the memory film or floating gates) located at levels of the electrically conductive layers 46.

The electrically conductive layers 46 may be patterned to provide a terrace region (i.e., contact region 200) in which each overlying electrically conductive layer 46 has a lesser lateral extent than any underlying electrically conductive layer 46. Stepped dielectric material portions 65 may be formed around each vertically alternating stack (32, 46) to provide electrical isolation among neighboring vertically alternating stacks (32, 46). The stepped dielectric material portions 65 can be formed on stepped surfaces of a respective vertically alternating stack (32, 46). Layer contact via structures 86 may be formed on the electrically conductive layers 46 in the terrace region to provide electrical connection to the electrically conductive layers 46. The layer contact via structures 86 can vertically extend through a respective stepped dielectric material portion 65, and can contact a respective one of the electrically conductive layers 46.

The dielectric material layers 660 and the metal interconnect structures 680 can be formed above the semiconductor devices 620 and the stepped dielectric material portions 65. The metal interconnect structures 680 include bit lines 682. Each bit line 682 electrically contacts a respective subset of the drain regions within the memory opening fill structures 58. The drain regions can contact the top end of a respective one of the vertical semiconductor channels 60. Thus, the bit lines can be electrically connected to a respective subset of the plurality of vertical NAND strings. The metal interconnect structures 680 include interconnect metal lines and interconnect metal via structures.

Each of the dielectric material layers 660 may include a respective dielectric material such as undoped silicate glass, a doped silicate glass, organosilicate glass, silicon nitride, a dielectric metal oxide, or a combination thereof. A pad-level dielectric layer (not shown) may be provided on top of the dielectric material layers 660. The pad-level dielectric layer, if present, may include a dielectric diffusion barrier layer such as a silicon nitride layer, or a first dielectric bonding material layer such as a silicon oxide layer that can be subsequently bonded to another dielectric bonding material layer of a logic die to be subsequently provided.

External pad cavities can be formed in an external pad region located at an edge of the semiconductor die 600. The edge of the semiconductor die 600 may be perpendicular to a first horizontal direction hd2, and may be parallel to a second horizontal direction hd2. The external pad cavities may be arranged along the second horizontal direction in a row or in a plurality of rows. Each row of external pad cavities laterally extends along the second horizontal direction hd2.

At least one conductive material can be deposited in the external pad cavities. The at least one conductive material can include an optional metallic liner and an underbump metallurgy (UBM) layer or layer stack. The metallic liner includes a material such as TiN, TaN, and/or WN, and may have a thickness in a range from 10 nm to 100 nm, although lesser and greater thicknesses may also be employed. The UBM layer or layer stack may include any UBM layer or layer stack that may be employed in the first embodiment. The thickness of the UBM layer or layer stack may be in a range from 1 micron to 30 microns, such as from 3 microns to 10 microns, although lesser and greater thicknesses may also be employed.

Excess portions of the at least one conductive material can be removed from above the topmost horizontal surface of the dielectric material layers 660. Remaining portions of the at least one conductive material comprise external bonding pads 698. Alternatively, the comprise external bonding pads 698 may be formed over dielectric material layers 660, and an additional dielectric material layer may be deposited around the external bonding pads 698 and can be subsequently planarized so that top surface of the external bonding pads 698 are physically exposed.

In one embodiment, the memory die 900 includes a logic circuit in region 800 containing semiconductor devices 720 located on a substrate 608 and configured to control operation of memory elements within a memory array, and metal interconnect structures 680 embedded in dielectric material layers 660 and providing electrical connection between the semiconductor devices of the logic circuit and the memory elements within the memory array. In one embodiment, the memory array may include a vertically alternating stack of insulating layers 32 and electrically conductive layers 46, a plurality of vertical NAND strings each including a respective vertical semiconductor channel and a respective vertical stack of memory elements located at levels of the electrically conductive layers 46, bit lines 682 electrically connected to a respective subset of the plurality of vertical NAND strings, a stepped dielectric material portion 65 located on stepped surfaces of the alternating stack (32, 46), and layer contact via structures 86 vertically extending through the stepped dielectric material portion 65 and contacting a respective one of the electrically conductive layers 46.

A handle substrate 400 can be attached to the side of the semiconductor die 600 that includes the external bonding pads 698, for example, employing a temporary adhesive layer (not shown). The handle substrate 400 may include a dielectric material, a conductive material, or a semiconductor material, and may have a thickness in a range from 500 microns to 10 mm, although lesser and greater thicknesses may also be employed.

Figure 9A:
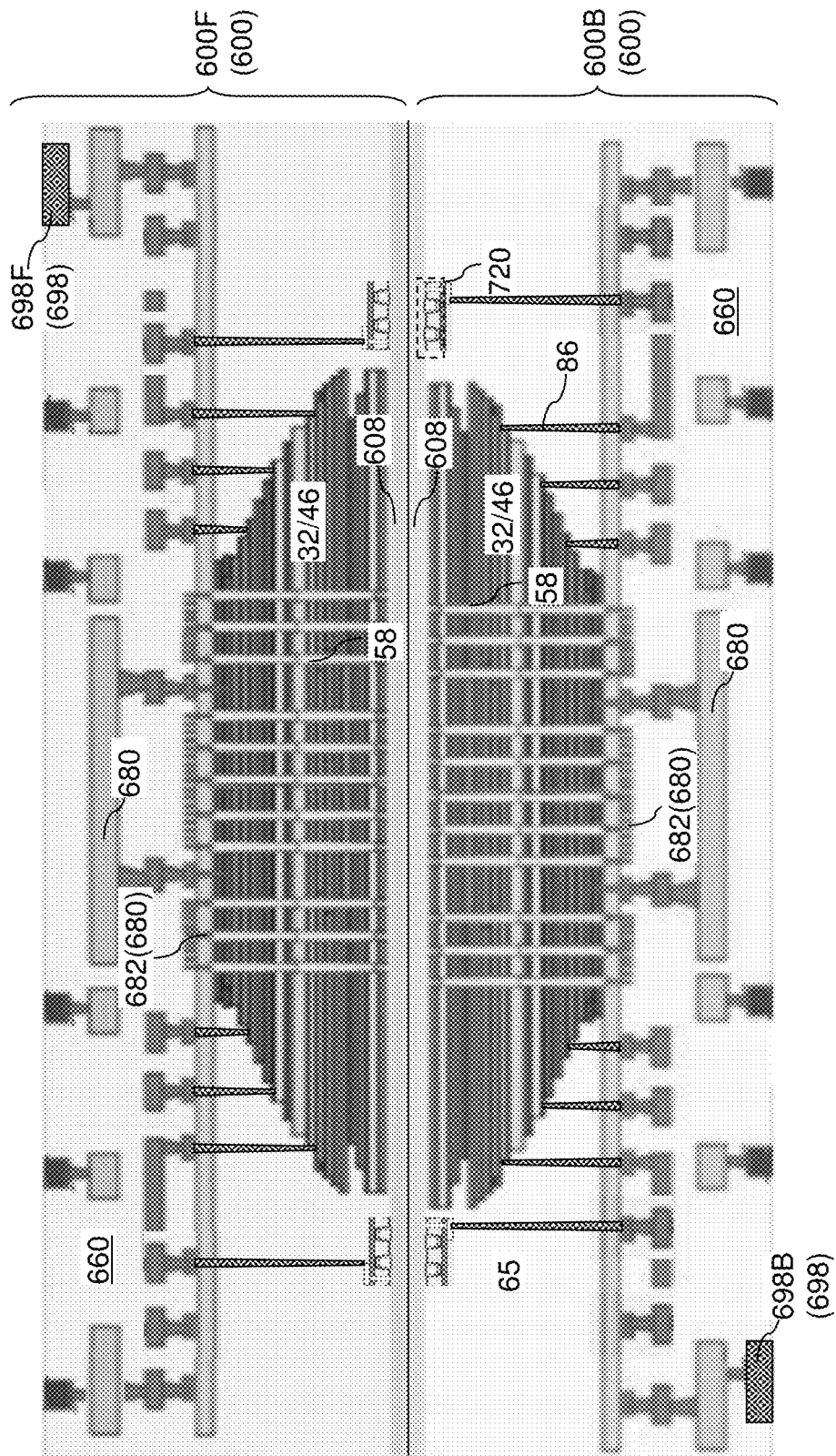
FIG. 9A is a vertical cross-sectional view of a bonded unit including a front-side semiconductor die and a backside semiconductor die according to the second embodiment of the present disclosure.
Figure 9B:
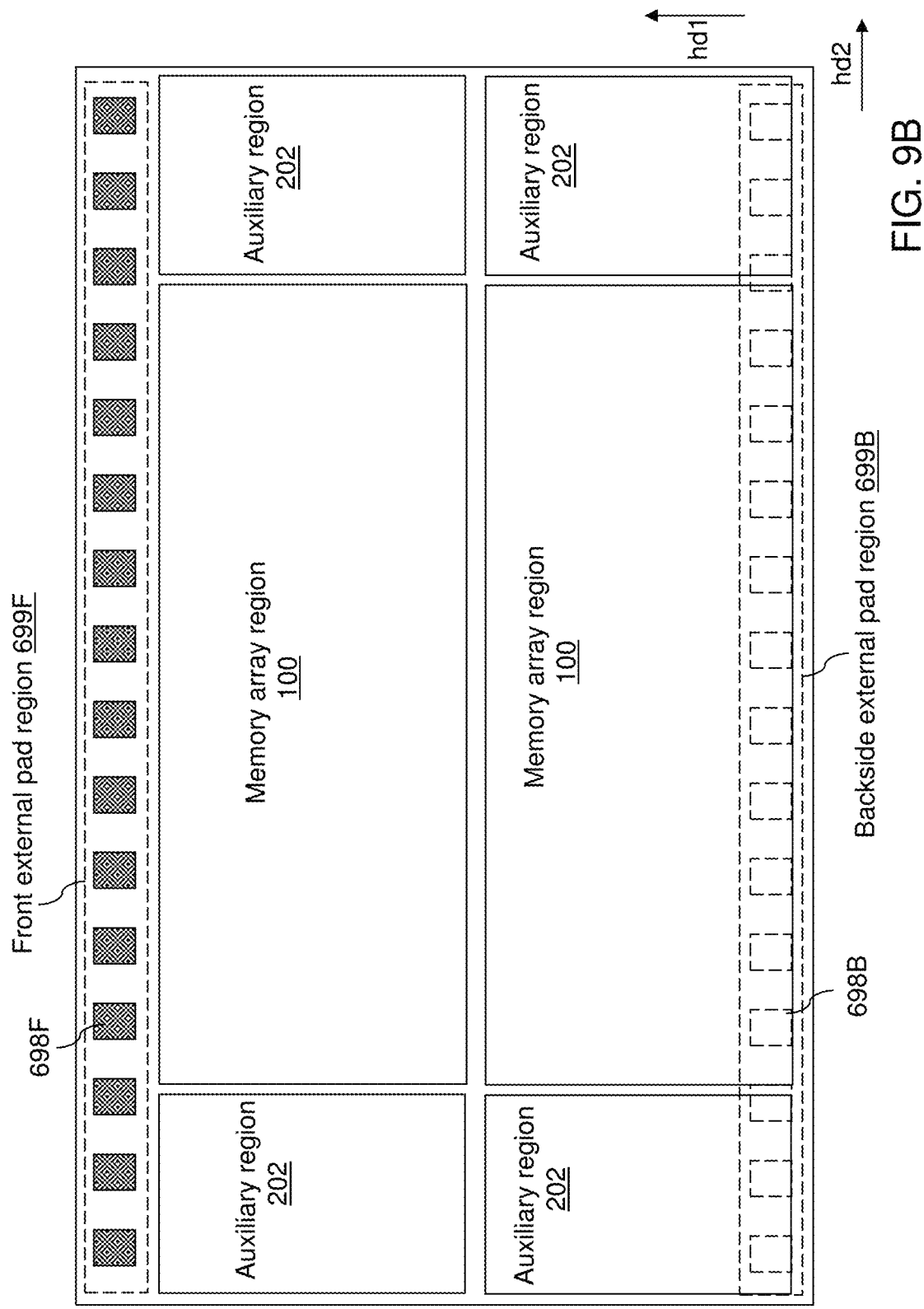
FIG. 9B is a partial see-through top-down view of the bonded unit of FIG. 9A.

Referring to FIGS. 9A-9C, two instances of the assembly of a semiconductor die 600 and a handle substrate 400 can be provided. Each semiconductor die 600 can be thinned from the backside. Specifically, each substrate 608 can be thinned from the backside. Each substrate 608 can be thinned by grinding, chemical etching, dry etching, and/or polishing. The handle substrates 400 can provide structural support to the first wafer and the second wafer during the thinning process.

Generally, a first semiconductor die 600 and a second semiconductor die 600 can be provided. The first semiconductor die 600 may be provided within a first wafer including a first plurality of memory dies 600, and the second semiconductor die 600 may be provided within a second wafer including a second plurality of memory dies 600. The first semiconductor die 600 is herein referred to as a front-side semiconductor die 600F, and the second semiconductor die 600 is herein referred to as a backside semiconductor die 600B.

The thinned substrate 608B of the backside semiconductor die 600B and the thinned substrate 608F of the front-side semiconductor die 600F are brought into contact with each other and then bonded to each other using wafer to wafer bonding. A bonded assembly of the semiconductor die 600F and the backside semiconductor die 600B comprises a bonded unit (600F, 600B). A plurality of bonded units (600F, 600B) can be formed. In one embodiment, the front-side semiconductor die 600F may be provided in a first wafer, and the backside semiconductor die 600B may be provided in a second wafer. In this case, a plurality of bonded units (600F, 600B) can be formed upon bonding the second wafer to the first wafer.

In one embodiment, no through substrate via structures extend through either of the thinned substrates (608B, 608F) and the bonded pair of the backside semiconductor die 600B and the front-side semiconductor die 600F are not electrically connected to each other through their respective thinned substrates (608B, 608F). In other embodiment, the bonded pair of the backside semiconductor die 600B and the front-side semiconductor die 600F are not directly electrically connected to each other at all through wire bonding or bonding pads. However, they may be indirectly electrically connected to each other through a common mounting substrate 300 as will be described in more detail below.

The bonded assembly of the first wafer and the second wafer can be subsequently diced along dicing channels to provide a plurality of bonded units (600F, 600B). In one embodiment, each bonded unit (600F, 600B) comprises a respective front-side semiconductor die 600F including a front-side memory array and front-side external bonding pads 698F, and a respective backside semiconductor die 600B including a backside memory array and backside external bonding pads 698B and bonded to the respective front-side semiconductor die 600F.

According to an aspect of the present disclosure, front-side semiconductor die 600F and the backside semiconductor die 600B are oriented during bonding such that the external bonding pads 698 of the front-side semiconductor die 600F (hereafter referred to as front-side external bonding pads 698F) are located on the opposite side (i.e., the opposite major surface of the bonded unit (600F, 600B) of the external bonding pads 698 of the backside semiconductor die 600B (hereafter referred to as backside external bonding pads 698B) in a plan view. The plan view is a view along the vertical direction, i.e., a view along the direction that is perpendicular to the interface between the front-side semiconductor die 600F and the backside semiconductor die 600B.

The front-side semiconductor die 600F and the backside semiconductor die 600B can be located on an opposite edges of the bonded unit (600F, 600B). For example, the bonded unit (600F, 600B) can have a first pair of straight edges that are parallel to each other and laterally spaced apart by a second pair of straight edges, the front-side external bonding pads 698F can be proximal to one of the first pair of straight edges, and the backside external bonding pads 698B can be proximal to another of the first pair of straight edges. The front-side external bonding pads 698F and the backside external bonding pads 698B can be laterally spaced apart along a first horizontal direction hd2, and each of the front-side external bonding pads 698F and the backside external bonding pads 698B can be arranged in a respective row (or a plurality of rows) that laterally extend along a second horizontal direction hd2 that is perpendicular to the first horizontal direction hd1.

Figure 10:
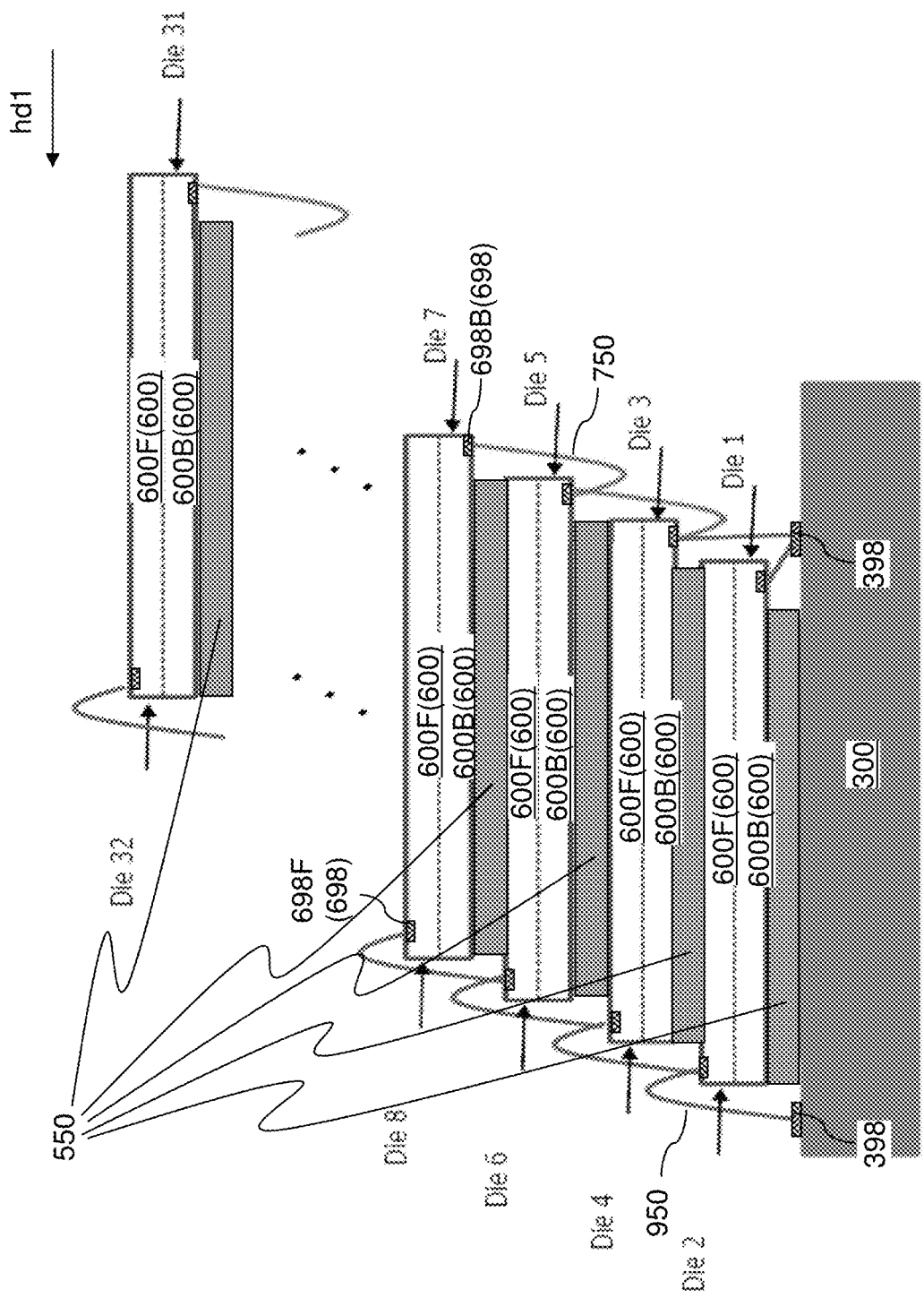
FIG. 10 is a vertical cross-sectional view of a second exemplary structure including a vertical stack of multiple bonded units and a mounting substrate after attaching bonding wires according to the second embodiment of the present disclosure.

Referring to FIG. 10, a second exemplary structure including a stacked die assembly according to the second embodiment of the present disclosure is illustrated. The stacked die assembly includes a vertical stack of the multiple bonded units (600F, 600B) formed by attaching vertically neighboring pairs of bonded units to each other. The attachment may be made using adhesive layers, mechanical clamps and/or a package which compresses the bonded units of the vertical stack together. In one embodiment, the stacked die assembly comprises a vertical stack of multiple bonded units (600F, 600B) and a mounting substrate 300 that are connected to each other by adhesive layers 550. Each vertically neighboring pair of bonded units (600F, 600B) can be attached to each other by a respective adhesive layer 550. The mounting substrate 300 can be attached to the vertical stack of the multiple bonded units (600F, 600B) employing an additional adhesive layer 550.

Generally, a vertical stack of the multiple bonded units (600F, 600B) can be formed by attaching the multiple bonded units (600F, 600B) to each other such that the external bonding pads (698F, 698B) of the multiple bonded units (600F, 600B) form a set of upward-facing external bonding pads having physically exposed surfaces that face upward and a set of downward-facing external bonding pads having physically exposed surfaces that face downward. For example, the bonded units (600F, 600B) can be staggered such that the external bonding pads (698F, 698B) are physically exposed. The front-side external bonding pads 698F of the front-side semiconductor die 600F may be physically exposed to face upward and the backside external bonding pads 698B of the backside semiconductor die 600B may be physically exposed to face downward.

A first set of bonding wires 950 can connect a respective pair of upward-facing external bonding pads among the set of upward-facing external bonding pads (which may be the front-side external bonding pads 698F). A second set of bonding wires 750 can connect a respective pair of downward-facing external bonding pads among the set of downward-facing external bonding pads (which may be the backside external bonding pads 698F).

In one embodiment, the multiple bonded units (600F, 600B) can be staggered such that each overlying bonded unit (600F, 600B) is laterally offset along the first horizontal direction hd1 relative to an underlying bonded unit (600F, 600B). The first horizontal direction hd1 is the direction along which the front-side external pad region of each bonded unit (600F, 600B) is laterally spaced apart from the backside external pad region of each bonded unit (600F, 600B).

The vertical stack of the multiple bonded units (600F, 600B) can be electrically connected to the mounting substrate 700 by attaching additional bonding wires (950, 750) to bonding pads 398 located on the mounting substrate 300 and to external bonding pads (698F, 698B) of a most proximal bonded unit (600F, 600B) among the vertical stack of the multiple bonded units (600F, 600B).

In one embodiment, the multiple bonded units (600F, 600B) can be attached to each other such that each upward-facing external bonding pad within the stacked die assembly does not have an areal overlap with any overlying bonded unit within the stacked die assembly in a plan view along a direction (such as a vertical direction) along which the bonded units are stacked, each downward-facing external bonding pad within the stacked die assembly does not have an areal overlap with any underlying bonded unit within the stacked die assembly in the plan view.

While FIG. 10 illustrates an embodiment in which sixteen bonded units (600F, 600B) comprising thirty two semiconductor die 600 are attached to a mounting substrate 300, embodiments are expressly contemplated herein in which any plurality of bonded units (600F, 600B) is attached to a mounting substrate 300. The mounting substrate 300 may be any packaging substrate. If the semiconductor dies 600 do not contain respective dedicated logic device regions 800, then the logic devices 720 may be located on the mounting substrate 300. In the illustrated example, each front-side semiconductor die 600F is labeled as an even-numbered die, and each backside semiconductor die 600B is labeled as an odd-numbered die. Numbers assigned to each semiconductor die 600 may be arbitrary.

Referring to FIGS. 8A-10 and related drawings and according to various embodiments of the present disclosure, a structure including a stacked die assembly (600F, 600B, 300, 950, 750, 550) is provided. The stacked die assembly (600F, 600B, 300, 950, 750, 550) comprises a vertical stack of multiple bonded units (600F, 600B), wherein each bonded unit (600F, 600B) comprises a respective front-side semiconductor die 600F including front-side external bonding pads 698F and a respective backside semiconductor die 600B including backside external bonding pads 698B, wherein the respective backside semiconductor die 600B is bonded to the respective front-side semiconductor die 600F, and wherein the front-side external bonding pads 698F of each bonded unit (600F, 600B) have physically exposed surfaces that face upward and the backside external bonding pads 698B of each bonded unit (600F, 600B) have physically exposed surfaces that face downward; a first set of bonding wires 950 connecting front-side external bonding pads 698F; and a second set of bonding wires 750 connecting the backside external bonding pads 698B.

In one embodiment, the front-side semiconductor die 600F further comprises a front-side memory array 620 and the backside semiconductor die further comprises a backside memory array 620.

In one embodiment, the front-side semiconductor die 600F within each bonded unit (600F, 600B) comprises front-side metal interconnect structures 680 embedded in front-side dielectric material layers 660, wherein a subset of the front-side metal interconnect structures 680 is connected to the front-side external bonding pads 698F within each bonded unit (600F, 600B); and the backside semiconductor die 600B within each bonded unit (600F, 600B) comprises backside metal interconnect structures 680 embedded in backside dielectric material layers 660, wherein a subset of the backside metal interconnect structures 680 is connected to the backside external bonding pads 698B within each bonded unit (600F, 600B).

In one embodiment, the front-side semiconductor die 600F within each bonded unit comprises a front-side substrate 608F; the backside semiconductor die 600B within each bonded unit comprises a backside substrate 608B; and the front-side substrate is bonded to the backside substrate. In one embodiment, the backside semiconductor die 600B and the front-side semiconductor die 600F in the same bonded unit are not directly electrically connected to each other.

In one embodiment, each vertically neighboring pair of bonded units (600F, 600B) comprises an overlying bonded unit (600F, 600B) and an underlying bonded unit (600F, 600B); and the overlying bonded unit (600F, 600B) is laterally offset along a first horizontal direction hd1 relative to the underlying bonded unit (600F, 600B). In one embodiment, front-side external bonding pads 698F within each front-side semiconductor die 600F are laterally offset from an edge of the front-side semiconductor die 600F with a uniform lateral offset distance along the first horizontal direction hd1; and the edge of the front-side semiconductor die 600F laterally extends along a second horizontal direction hd2 that is perpendicular to the first horizontal direction hd1. In one embodiment, backside external bonding pads 698B within backside semiconductor die 600B are laterally offset from an edge of the backside semiconductor die 600B with a uniform lateral offset distance; and the edge of the backside semiconductor die 600B laterally extends along a second horizontal direction hd2 that is perpendicular to the first horizontal direction hd1.

In one embodiment, each front-side external bonding pad 698F within the stacked die assembly (600F, 600B, 300, 950, 750, 550) does not have an areal overlap with any overlying bonded unit (600F, 600B) within the stacked die assembly (600F, 600B, 300, 950, 750, 550) in a plan view along a direction along which the bonded units (600F, 600B) are stacked; and each backside external bonding pad 698B within the stacked die assembly (600F, 600B, 300, 950, 750, 550) does not have an areal overlap with any underlying bonded unit (600F, 600B) within the stacked die assembly (600F, 600B, 300, 950, 750, 550) in the plan view.

In one embodiment, each vertically neighboring pair of bonded units (600F, 600B) is attached to each other by a respective adhesive layer 550. In one embodiment, the vertical stack of multiple bonded units (600F, 600B) can be mounted on a mounting substrate 300 by an additional adhesive layer 550; and additional bonding wires (950, 750) can provide electrical connection between bonding pads 398 located on the mounting substrate 300 and front-side bonding pads 698F and backside external bonding pads 698B of a most proximal bonded unit (600F, 600B) among the bonded units 600F, 600B) of the stacked die assembly (600F, 600B, 300, 950, 750, 550).

In one embodiment, each of the front-side semiconductor dies 600F and the backside semiconductor dies 600B comprises: a respective logic circuit including semiconductor devices located on a respective substrate 608 and configured to control operation of memory elements within the respective memory array; and respective metal interconnect structures 680 embedded in respective dielectric material layers 660 and providing electrical connection between the semiconductor devices of the respective logic circuit and the memory elements within the respective memory array. In one embodiment, the respective memory array comprises: a vertically alternating stack of insulating layers 32 and electrically conductive layers 46; a plurality of memory opening fill structures 58 each including a respective vertical semiconductor channel and a respective vertical stack of memory elements located at levels of the electrically conductive layers 46; bit lines electrically connected to a respective subset of the plurality of memory opening fill structures 58; a stepped dielectric material portion 65 located on stepped surfaces of the alternating stack (32, 46); and layer contact via structures 86 vertically extending through the stepped dielectric material portion 65 and contacting a respective one of the electrically conductive layers 46.

The various embodiments of the present disclosure provide concurrent front-side wire bonding on front-side external bonding pads and backside wire bonding on backside external bonding pads on an unlimited number of stacked bonded units, thereby providing multi-level die stacking. The double-side connection configuration can increase the total external pad area that can be used for wire bonding without sacrificing valuable device space for additional wire bonding pads.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A structure including a stacked die assembly, wherein the stacked die assembly comprises:
  a vertical stack of multiple bonded units, wherein each bonded unit comprises:
    a memory die including memory-side inter-die bonding pads and memory-side external bonding pads that are located on opposite major surfaces of the memory die; and
    a logic die including a logic circuit configured to control operation of the memory die, and including logic-side inter-die bonding pads and logic-side external bonding pads that are located on opposite major surfaces of the logic die,
  wherein:
    the logic-side inter-die bonding pads are bonded to a respective one of the memory-side inter-die bonding pads; and
    the memory-side external bonding pads and the logic-side external bonding pads comprise a set of upward-facing external bonding pads having physically exposed surfaces that face upward and a set of downward-facing external bonding pads having physically exposed surfaces that face downward;
  a first set of bonding wires connecting upward-facing external bonding pads; and
  a second set of bonding wires connecting downward-facing external bonding pads.

2. The structure of claim 1, wherein:
  each vertically neighboring pair of bonded units comprises an overlying bonded unit and an underlying bonded unit; and
  the overlying bonded unit is laterally offset along a first horizontal direction relative to the underlying bonded unit.

3. The structure of claim 2, wherein:
  memory-side external bonding pads within each memory die are laterally offset from an edge of the memory die with a uniform lateral offset distance along the first horizontal direction; and the edge of the memory die laterally extends along a second horizontal direction that is perpendicular to the first horizontal direction.

4. The structure of claim 3, wherein:
logic-side external bonding pads within each logic die are laterally offset from an edge of the logic die with a uniform lateral offset distance; and
the edge of the logic die laterally extends along the second horizontal direction that is perpendicular to the first horizontal direction.

5. The structure of claim 1, wherein:
each upward-facing external bonding pad within the stacked die assembly does not have an areal overlap with any overlying bonded unit within the stacked die assembly in a plan view along a direction along which the bonded units are stacked; and
each downward-facing external bonding pad within the stacked die assembly does not have an areal overlap with any underlying bonded unit within the stacked die assembly in the plan view.

6. The structure of claim 1, wherein:
the set of upward-facing external bonding pads comprises the memory-side external bonding pads and the set of downward-facing external bonding pads comprises the logic-side external bonding pads; or
the set of downward-facing external bonding pads comprises the logic-side external bonding pads and the set of downward-facing external bonding pads comprises the memory-side external bonding pads.

7. The structure of claim 1, further comprising:
a mounting substrate on which the vertical stack of multiple bonded units is mounted by an additional adhesive layer; and
additional bonding wires providing electrical connection between external bonding pads of a most proximal bonded unit of the multiple bonded units and bonding pads located on the mounting substrate, wherein each vertically neighboring pair of bonded units is attached to each other by a respective adhesive layer.

8. The structure of claim 1, wherein the logic-side inter-die bonding pads are bonded to the respective one of the memory-side inter-die bonding pads within each bonded unit by metal-to-metal bonding.

9. The structure of claim 1, wherein one of the memory dies comprises:
a three-dimensional memory array located over a memory-die substrate;
memory-die metal interconnect structures embedded in memory-die dielectric material layers; and
through-substrate via structures vertically extending through the memory-die substrate and electrically connected to a respective one of the memory-side external bonding pads.

10. The structure of claim 9, wherein the three-dimensional memory array comprises:
an alternating stack of insulating layers and electrically conductive layers;
a plurality of memory opening fill structures vertically extending through the alternating stack;
bit lines electrically connected to a respective subset of the plurality of memory opening fill structures;
a stepped dielectric material portion located on stepped surfaces of the alternating stack; and
layer contact via structures vertically extending through the stepped dielectric material portion and contacting a respective one of the electrically conductive layers.

11. The structure of claim 10, wherein the logic dies that is bonded to the one of the memory dies comprises:
a sense amplifier region including sense amplifiers electrically connected to a respective one of the bit lines; and
a peripheral device region including a charge pump circuit.

12. The structure of claim 11, wherein the peripheral device region is located between the sense amplifier region and the logic-side external bonding pads.

13. The structure of claim 1, wherein at least one of the logic dies comprises:
through-substrate via structures vertically extending through a logic-die substrate and electrically connected to a respective one of the logic-side external bonding pads; and
logic-die metal interconnect structures embedded in logic-die dielectric material layers and electrically connecting a respective logic device on the logic-die substrate to a respective one of the logic-side inter-die bonding pads.

14. A method of forming a structure including a stacked die assembly, the method comprising:
providing multiple bonded units, wherein each bonded unit comprises a memory die including memory-side inter-die bonding pads and memory-side external bonding pads that are located on opposite major surfaces of the memory die, and comprises a logic die including a logic circuit configured to control operation of the memory die and including logic-side inter-die bonding pads and logic-side external bonding pads that are located on opposite major surfaces of the logic die;
forming a vertical stack of the multiple bonded units by attaching the multiple bonded units to each other such that the memory-side external bonding pads and the logic-side external bonding pads of the multiple bonded units form a set of upward-facing external bonding pads having physically exposed surfaces that face upward and a set of downward-facing external bonding pads having physically exposed surfaces that face downward;
forming a first set of bonding wires that connect a respective pair of upward-facing external bonding pads of the set of upward-facing external bonding pads; and
forming a second set of bonding wires that connect a respective pair of downward-facing external bonding pads of the set of downward-facing external bonding pads.

15. The method of claim 14, wherein each bonded unit is provided by bonding a respective logic die and a respective memory die such that logic-side inter-die bonding pads of the respective logic die are bonded to a respective one of memory-side inter-die bonding pads of the respective memory die.

16. The method of claim 14, wherein the multiple bonded units are staggered such that each overlying bonded unit is laterally offset along a first horizontal direction relative to an underlying bonded unit.

17. The method of claim 14, further comprising forming the vertical stack of the multiple bonded units by attaching vertically neighboring pairs of bonded units employing adhesive layers.

18. The method of claim 17, further comprising:
attaching a mounting substrate to the vertical stack of the multiple bonded units employing an additional adhesive layer; and electrically connecting the vertical stack of the multiple bonded units to the mounting substrate by attaching additional bonding wires to bonding pads located on the mounting substrate and to external bonding pads of a most proximal bonded unit among the vertical stack of the multiple bonded units.

19. The method of claim 14, wherein providing multiple bonded units comprises forming each of the multiple bonded units by bonding a respective memory die and a respective logic die to each other.

20. The method of claim 14, further comprising attaching the multiple bonded units to each other such that:
   each upward-facing external bonding pad within the stacked die assembly does not have an areal overlap with any overlying bonded unit within the stacked die assembly in a plan view along a direction along which the bonded units are stacked; and
   each downward-facing external bonding pad within the stacked die assembly does not have an areal overlap with any underlying bonded unit within the stacked die assembly in the plan view.

\* \* \* \* \*